(12) United States Patent
Park et al.

(10) Patent No.: US 11,873,552 B2
(45) Date of Patent: Jan. 16, 2024

(54) SUBSTRATE COMPRISING PLASMONIC CONTINUOUS FILM WITH CURVED SURFACE AND MANUFACTURING METHOD THEREOF

(71) Applicant: Korea Institute of Materials Science, Gyeongsangnam-do (KR)

(72) Inventors: Sung-Gyu Park, Changwon-si (KR); Do-Geun Kim, Changwon-si (KR); Seung-Hoon Lee, Changwon-si (KR); Dong-Ho Kim, Changwon-si (KR)

(73) Assignee: KOREA INSTITUTE OF MATERIALS SCIENCE, Gyeongsangnam-Do (KR)

( * ) Notice: Subject to any disclaimer, the term of this patent is extended or adjusted under 35 U.S.C. 154(b) by 864 days.

(21) Appl. No.: 16/750,820

(22) Filed: Jan. 23, 2020

(65) Prior Publication Data

US 2021/0017638 A1 Jan. 21, 2021

(30) Foreign Application Priority Data

Jul. 16, 2019 (KR) .......................... 10-2019-0085971

(51) Int. Cl.
| | |
|---|---|
| *B82Y 20/00* | (2011.01) |
| *G02B 5/00* | (2006.01) |
| *C23C 14/04* | (2006.01) |
| *C23C 14/20* | (2006.01) |
| *C23C 14/02* | (2006.01) |
| *C23C 14/28* | (2006.01) |
| *C23C 14/34* | (2006.01) |
| *C23C 14/16* | (2006.01) |

(52) U.S. Cl.
CPC ............ *C23C 14/046* (2013.01); *B82Y 20/00* (2013.01); *C23C 14/028* (2013.01); *C23C 14/16* (2013.01); *C23C 14/20* (2013.01); *C23C 14/28* (2013.01); *C23C 14/3442* (2013.01); *G02B 5/008* (2013.01)

(58) Field of Classification Search
CPC ................................ B82Y 20/00; G02B 5/008
USPC ......................................................... 428/546
See application file for complete search history.

(56) References Cited

FOREIGN PATENT DOCUMENTS

| | | |
|---|---|---|
| JP | 2015-052562 A | 3/2015 |
| KR | 101448111 B1 | 10/2014 |
| KR | 10-2016-0109626 A | 9/2016 |

OTHER PUBLICATIONS

Suzuki et al., JP 2015/052562 A Google Patents machine translation printed Jan. 18, 2023, Mar. 19, 2015, entire translation (Year: 2015).*

(Continued)

*Primary Examiner* — Katherine A Christy
(74) *Attorney, Agent, or Firm* — PEARNE & GORDON LLP

(57) ABSTRACT

A substrate including plasmonic continuous film with curved surface and a method for manufacturing the same. More particularly, a substrate for an ultrasensitive spectroscopic sensor includes bowl-shaped plasmonic curved nanodimples and spiked plasmonic nanotips formed at contact points between the nanodimples at the same time, thereby greatly increasing the total volume of hotspots and being capable of concentrating and analyzing an extremely small amount of a sample.

17 Claims, 35 Drawing Sheets

(56) References Cited

OTHER PUBLICATIONS

Park et al., "Fabrication of highly uniform three-dimensional SERS substrates by control of wettability, Journals of Materials Chemistry", Nov. 26, 2012, URL: <https://pubs.rsc.org/en/content/articlepdf/2013/tc/c2tc00512c>, pp. 426-431 (Year: 2012).*

Korean Office Action dated Aug. 20, 2020 issued in corresponding Korean Appln. No. 10-2019-0085971.

Tae Yoon Jeon, et al., "Shape Control of Ag Nanostructures for Practical SERS Substrates," ACS Applied Materials and Interfaces, 2013, 5, 243-248.

Peng Mao, et al., "Broadband single molecule SERS detection designed by warped optical spaces," Nature Communications, 2018, 9, 5428.

* cited by examiner

SUBSTRATE COMPRISING PLASMONIC CONTINUOUS FILM WITH CURVED SURFACE AND MANUFACTURING METHOD THEREOF

CROSS REFERENCE TO RELATED APPLICATION(S)

This application claims the benefit under 35 USC § 119(a) of Korean Patent Application No. 10-2019-0085971 filed on Jul. 16, 2019 in the Korean Intellectual Property Office, the entire disclosure of which is incorporated herein by reference for all purposes.

BACKGROUND

1. Field

The present invention relates to a substrate including a plasmonic continuous film with curved surface and a method of manufacturing the same. More particularly, the present invention relates to a substrate for an ultrasensitive spectroscopic sensor, which includes bowl-shaped plasmonic curved nanodimples and spiked plasmonic nanotips formed at contact points between the nanodimples at the same time, thereby greatly increasing the total volume of plasmonic hotspots and being capable of concentrating and analyzing an extremely small amount of a sample, and a method for manufacturing the same.

2. Description of Related Art

Noble metal nanostructures such as gold and silver nanostructures can induce localized surface plasmon resonance (LSPR) by the interactions between incident light and free electrons in the metal to focus the incident light on the sharp tips and edges (so-called "hotspots") of the metal nanostructures.

This LSPR phenomenon can induce surface-enhanced Raman spectroscopy (SERS), which amplifies Raman scattering signal of molecules adsorbed onto the surfaces of nanostructures by $10^6$-fold or more, and plasmon-enhanced fluorescence (PEF), which amplifies fluorescence signal by $10^2$ or more. Thus, it is possible to provide a plasmonic chip for ultrasensitive spectroscopic sensor.

The plasmonic nanostructures can be broadly divided into nanopillars in the form of protruded portions (hereinafter, referred to as 'spiked') from the substrate and nanodimples in the form of recessed portions (hereinafter, referred to as 'bowl-shaped') from the substrate.

Non-patent document 1 (Shape control of Ag nanostructures for practical SERS substrates, ACS Applied Materials and Interfaces, 2013, 5, 243-248) describes a conventional technique for producing bowl-shaped plasmonic nanodimple arrays. Referring to FIG. 1, non-patent document 1 discloses that $SiO_2$ particles (about 500 nm) prepared by a solution method is deposited on a substrate including a polymer (SU-8) film through spin coating to form a monolayer, and then after the substrate is heated above the glass transition temperature of the polymer to precipitate $SiO_2$ particles inside the SU-8 film, the substrate is placed into a HF aqueous solution to selectively remove the $SiO_2$ particles to provide a polymer nanodimple array. Non-patent document 1 also discloses that Ag is then vacuum-deposited to form hemispherical Ag nanodimples on a bottom part and a film including an Ag nanohole structure on an upper part to be spaced apart from each other. According to Non-Patent Document 1, further $SF_6$ plasma treatment and Ag vacuum deposition of the SU-8 dimple array leads a substrate having triangular-shaped plasmonic nanoplates on the upper part and Ag nanodimple structures on the bottom part to be spaced apart from each other.

Non-patent document 2 (Broadband single molecule SERS detection designed by warped optical spaces, Nature Communications, 2018, 9, 5428.) describes another technique for forming plasmonic nanodimples. Referring to FIG. 2 shown in the non-patent document 2, Au is vacuum-deposited on 1 micron-sized $SiO_2$ particles formed as a monolayer on a substrate, and then the substrate is placed in an HF aqueous solution to selectively remove the $SiO_2$ particles to form a hemispherical Au nanodimple array which is floated on the surface of the aqueous solution and transferred to the substrate to provide a substrate including a hemispherical Au nanodimple array. According to the above technique, since Au is deposited on $SiO_2$ particles through vacuum deposition, a hemispherical nanodimple array substrate having a depth-to-radius ratio (depth/radius) of a plasmonic nanodimple array of 1 can be provided.

However, since the nanodimple array substrate cannot increase the surface density and the depth-to-radius ratio of the nanodimples, there is a limit in increasing the total volume of the hotspots.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An object of the present invention is to provide a substrate including plasmonic continuous film with curved surface which can increase the total volume of hotspots and concentrate and analyze a trace amount of a sample.

Another object of the present invention is to provide a method for efficiently manufacturing a substrate including a continuous plasmonic thin film with curved surface.

The present invention related to a substrate for an ultrasensitive spectroscopic sensor, which includes bowl-shaped plasmonic curved nanodimples and spiked plasmonic nanotips formed at contact points between the nanodimples at the same time and a depth-to-radius ratio of the nanodimples is 1.5 or above, thereby greatly increasing the total volume of hotspots and being capable of concentrating and analyzing an extremely small amount of a sample, and a method for manufacturing the same.

According to one aspect, there is provided a substrate including a base substrate including bowl-curved-shaped nanodimples and spiked nanotips formed at contact points between the nanodimples; and a plasmonic continuous film with curved surface formed on the base substrate, wherein a depth-to-radius ratio of the plasmonic nanodimple of the plasmonic continuous film is 1.5 or above.

According to an embodiment, an inclination angle of a side surface of the nanodimple of the plasmonic continuous film may be 30 to 60 degrees.

According to an embodiment, the base substrate may be made of one or more selected from polymer, glass, silicon, and paper.

According to an embodiment, an inclination angle of a side surface of the nanodimple formed on the base substrate may be 30 to 60 degrees and a depth-to-radius ratio thereof may be 1.5 or above.

According to an embodiment, a surface density of the nanodimples formed on the base substrate may be 30/μm² to 80/μm².

According to an embodiment, a surface density of the nanotips formed on the base substrate may be 40/μm² to 90/μm².

According to an embodiment, the nanodimples and the nanotips may be formed by ion beam treatment, plasma etching, soft lithography, nanoimprint lithography, or photo lithography.

According to an embodiment, a diameter of the plasmonic nanodimple of the plasmonic continuous film may be 10 nm to 100 nm.

According to an embodiment, a surface density of the plasmonic nanodimples of the plasmonic continuous film may be 30/μm² to 80/μm².

According to an embodiment, a surface density of the plasmonic nanotips of the plasmonic continuous film may be 40/μm² to 90/μm².

According to an embodiment, a thickness of the plasmonic continuous film may be 10 nm to 200 nm.

According to an embodiment, the plasmonic continuous film may be formed by a vacuum deposition or a solution process.

According to an embodiment, the plasmonic continuous film may be a metal-containing thin film.

According to an embodiment, the metal may be Au, Ag, Cu, Al, Pt, Pd, Ti, Rd, Ru, or an alloy thereof.

According to an embodiment, the metal-containing nanoparticles may be further formed on the metal-containing film.

According to an embodiment, an insulating layer and an additional metal-containing film may be further formed on the metal-containing film.

According to another aspect, there is provided a method for manufacturing a substrate including a plasmonic continuous film, which includes forming nanodimples and nanotips on a base substrate; and forming a plasmonic continuous film with curved surface on the base substrate, wherein a depth-to-radius ratio of the nanodimple of the plasmonic continuous film is formed to be 1.5 or above in the step of forming a plasmonic continuous film.

According to an embodiment, the step of forming nanodimples and nanotips may include irradiating gas particles in the energy of 500 eV or more to the base substrate made of a polymer.

According to an embodiment, the polymer may have a density of 1.3 to 1.5 g/cm³.

According to an embodiment, the step of forming nanodimples and nanotips may include irradiating ion beam dose of 2×10¹⁷ ions/cm² or less to the base substrate made of a polymer.

According to an embodiment, there is provided a substrate including continuous plasmonic thin film with curved surface, which includes bowl-shaped plasmonic curved nanodimples and spiked plasmonic nanotips formed at contacts between the nanodimples at the same time and has a depth-to-radius ratio of the plasmonic nanodimples is 1.5 or above.

According to an embodiment, there is provided a substrate for an ultrasensitive spectroscopic sensor, which allows an incident light to focus inside nanodimples due to inner curved surfaces of the three-dimensional (3D) plasmonic nanodimples to increase the volume of the 3D hotspots and concentrate and analyze a trace amount of a sample in the 3D hotspots.

According to an embodiment, there is provided a method for efficiently manufacturing a continuous plasmonic thin film with curved surface which is able to increase the total volume of hotspots and concentrate and analyze a trace amount of a sample.

Other features and aspects will be apparent from the following detailed description, the drawings, and the claims.

DETAILED DESCRIPTION

Figure 1:
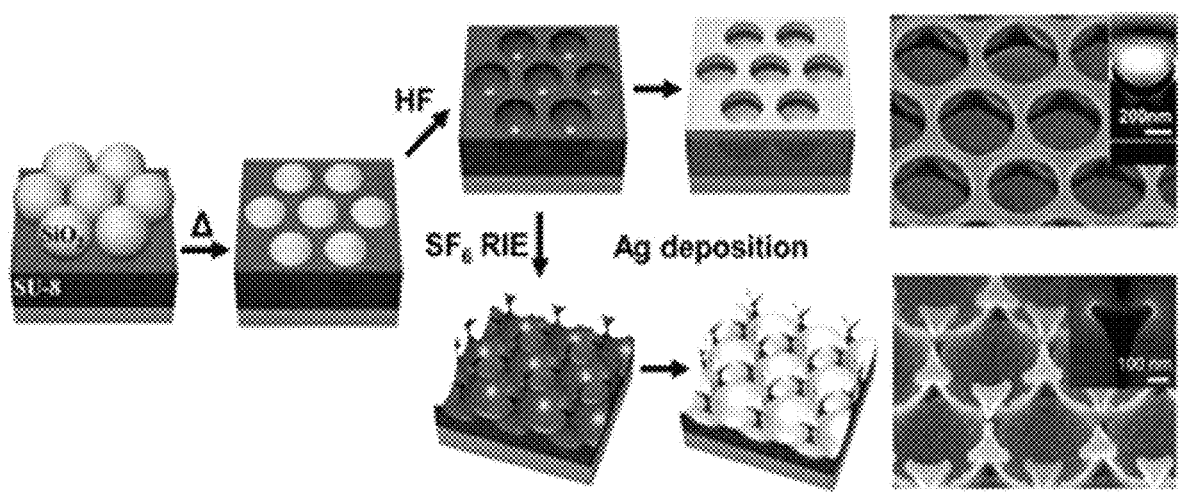
FIG. 1 is a schematic diagram illustrating a conventional method for manufacturing a nanodimple array substrate.
Figure 2:
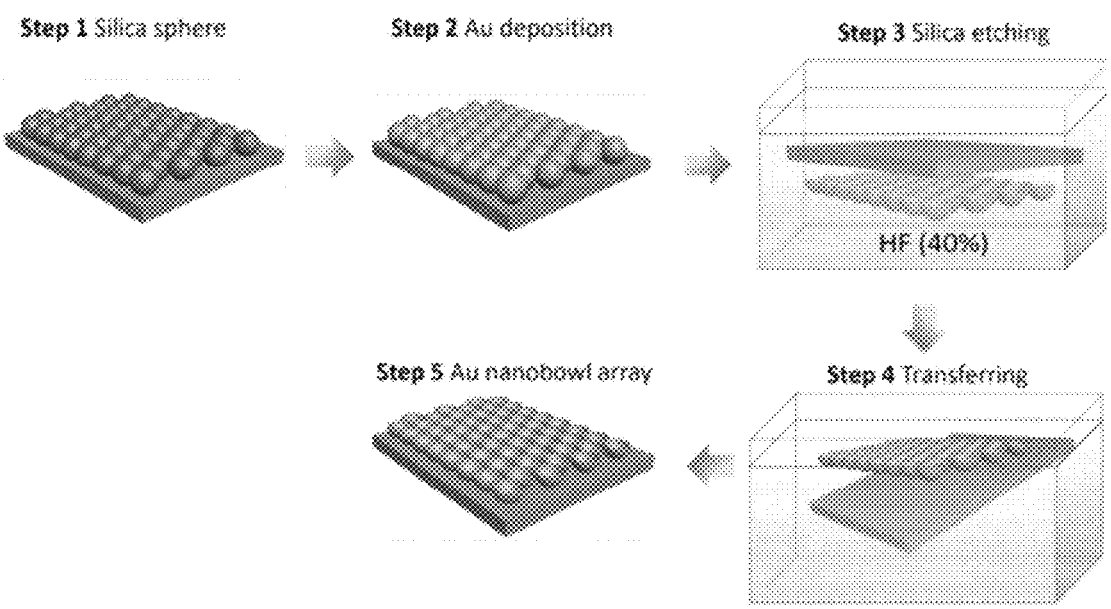
FIG. 2 is a schematic diagram illustrating another conventional method for manufacturing a nanodimple array substrate.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

In the present specification, when a component such as a layer, part, portion, or substrate is described as being "on", "connected", or "coupled" to another component, it is directly on another component "on", "connected", or "coupled" and may be interposed between one or more other components. In contrast, if a component is described as being "directly on", "directly connected", or "directly coupled" to another component, no other component may be interposed between the two components.

The terms used in the description are intended to describe certain embodiments only, and shall by no means restrict the present disclosure. Unless clearly used otherwise, expressions in the singular number include a plural meaning.

In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

In the present specification, when a part is said to "include" or "comprise" a certain component, it means that it may further include other components, without excluding the other components unless otherwise stated. In addition, throughout the specification, "on" means to be located above or below the target portion, and does not necessarily mean to be located above the gravity direction.

While the present disclosure has been described with reference to particular embodiments, it is to be appreciated that various changes and modifications may be made by those skilled in the art without departing from the spirit and scope of the present disclosure, as defined by the appended claims and their equivalents. Throughout the description of the present disclosure, when describing a certain technology is determined to evade the point of the present disclosure, the pertinent detailed description will be omitted.

Embodiments of the disclosure will be described below in more detail with reference to the accompanying drawings, in which those components are rendered the same reference number that are the same or are in correspondence, regardless of the figure number, and redundant explanations are omitted.

Figure 3A:
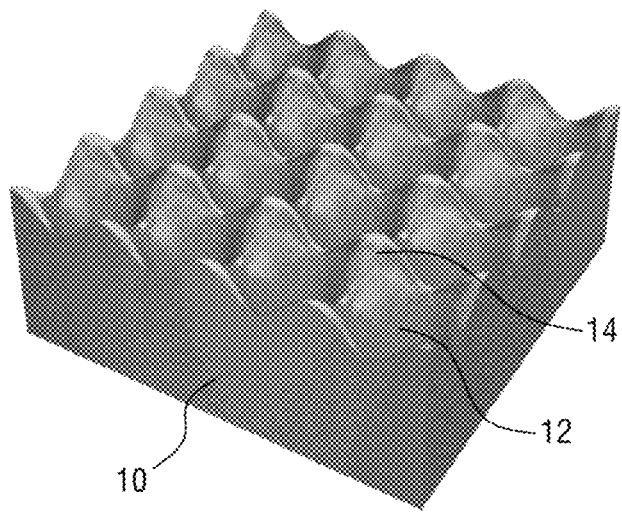
FIG. 3A is a schematic diagram illustrating a base substrate including bowl-shaped nanodimples and spiked nanotips according to an embodiment of the present invention.
Figure 3B:
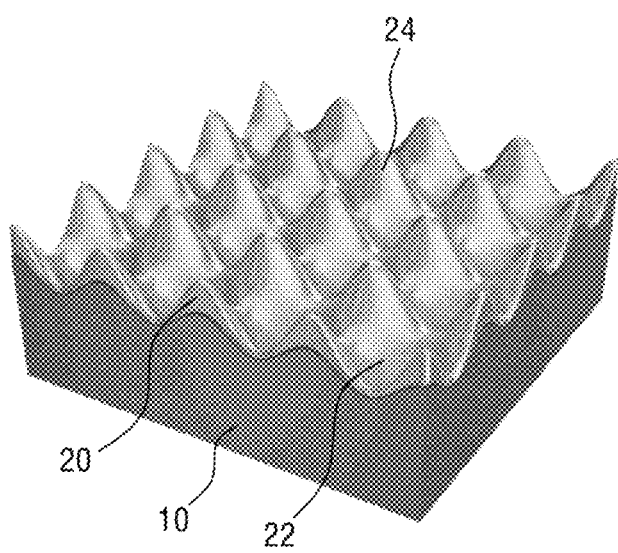
FIG. 3B is a schematic diagram illustrating a substrate including a plasmonic continuous film formed on the base substrate of FIG. 3A.
Figure 4A:
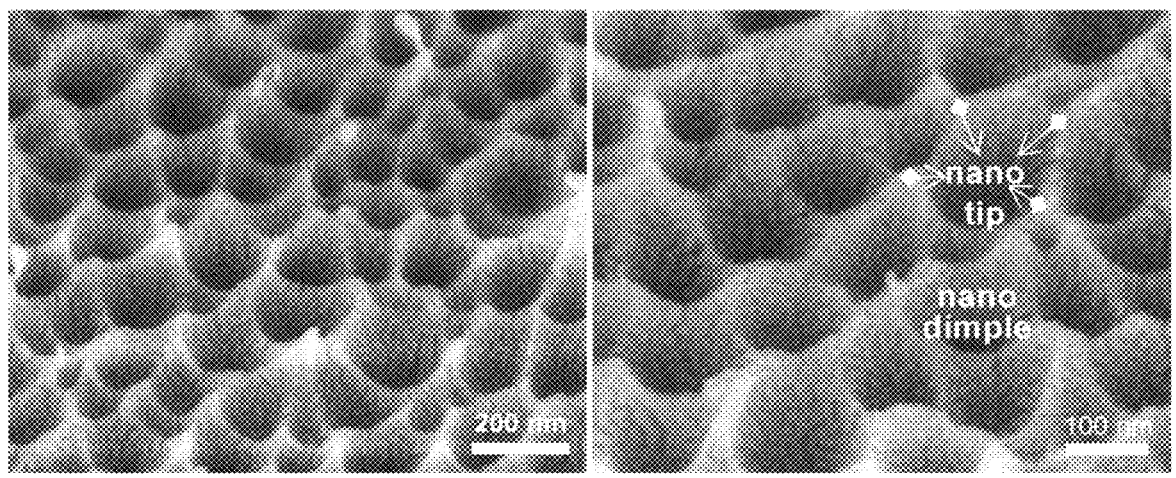
FIGS. 4A, 4B, 4C, and 4D illustrate SEM images of various polymer substrates including bowl-shaped nanodimples and spiked nanotips depending on oxygen ion beam dose according to an embodiment of the present invention.
Figure 4B:
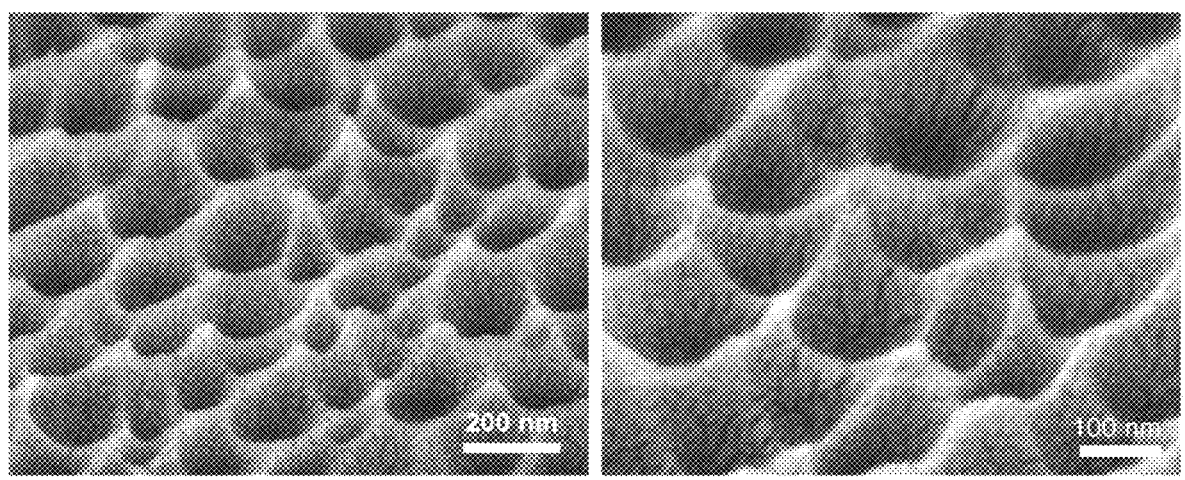
Figure 4C:
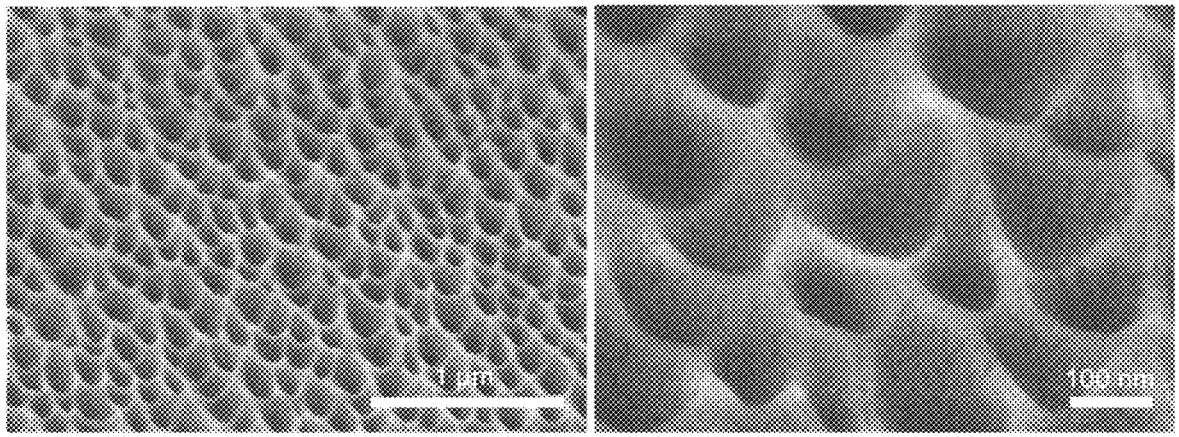
Figure 4D:
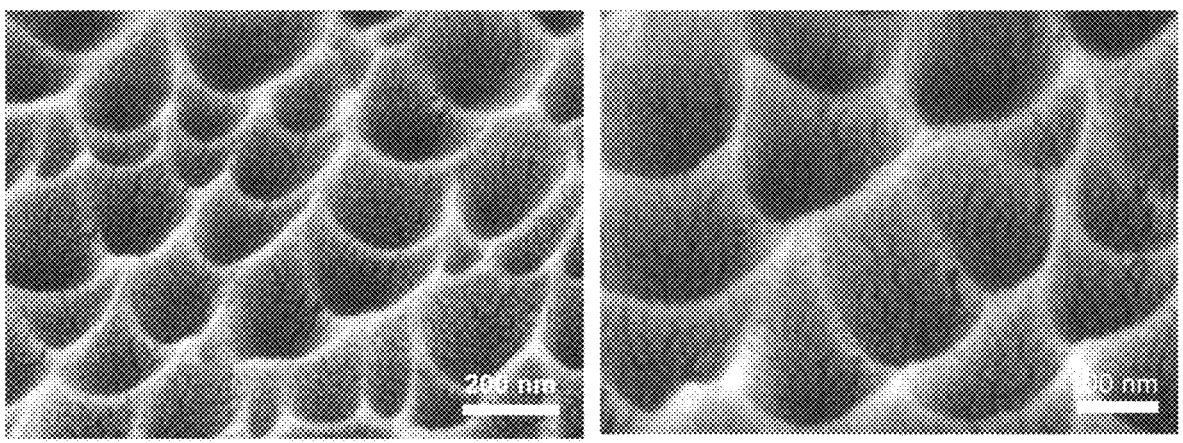

FIG. 3A is a schematic diagram illustrating a base substrate including bowl-shaped nanodimples and spiked nanotips according to an embodiment of the present invention, and FIG. 3B is a schematic diagram illustrating a substrate including a plasmonic continuous film formed on the base substrate of FIG. 3A.

Referring to FIG. 3A and FIG. 3B, a substrate including a plasmonic continuous film of the present application includes a base substrate 10 including bowl-curved-shaped nanodimples 12 and nanotips 14; and a plasmonic continuous film with curved surface 20 formed on the base substrate 10, wherein a depth-to-radius ratio of the plasmonic nanodimples 22 of the plasmonic continuous film 20 is 1.5 or above.

The base substrate 10 is configured to simultaneously include bowl-curved-shaped nanodimples 12 and spiked (hereinafter, used in combination with "convex") nanotips 14 formed at contact points between the nanodimples 12.

The nanodimples 12 formed on the base substrate 10 may have an inclination angle of 30 to 60 degrees and a depth-to-radius ratio of the nanodimples 12 may be 1.5 or above. Due to such a configuration, a depth-to-radius ratio of the plasmonic nanodimple 22 of the plasmonic continuous film 20 may be easily formed to be 1.5 or above, and an inclination angle of side surface of the plasmonic nanodimple 22 may be 30 to 60 degrees.

When the depth-to-radius ratio of the plasmonic nanodimple 22 is 1.5 or above as described above, the light incident can be focused in the inner space of the 3D plasmonic nanodimples 22 by the curvature of the plasmonic nanodimples 22, thereby being capable of maximizing the total volume of hotspots and concentrating extremely small amount of molecules in the inner space of the 3D plasmonic nanodimples 22 to provide a substrate for ultrasensitive spectroscopic sensor (SERS and PEF).

The base substrate 10 may be made of one or more selected from polymer, glass, silicon, and paper. The base substrate 10 may be made of a polymer to be suitable for forming the nanodimples 22 and the nanotips 14 having a predetermined shape, but it is not limited thereto.

A surface density of the nanodimples 12 formed on the base substrate 10 may be 30/$\mu m^2$ to 80/$\mu m^2$, but it is not limited thereto. Due to such a configuration, it is possible to increase the volume of 3D hotspots, thereby greatly amplifying the SERS signal.

When a surface density of the nanodimples 12 formed on the base substrate 10 is less than 30/$\mu m^2$, effects of increasing the volume of 3D hotspots and amplifying the SERS signal may not be sufficient. On the other hand, when it is greater than 80/$\mu m^2$, it may be difficult to form a plasmonic continuous film with curved surface, resulting in forming a flat film, so that effects of increasing the volume of 3D hotspots and amplifying the SERS signal may be insignificant.

A surface density of the nanotips 14 formed on the base substrate 10 may be 40/$\mu m^2$ to 90/$\mu m^2$, but it is not limited thereto. Due to such a configuration, it is possible to concentrate electric fields on the sharp tips of the plasmonic nanostructures, thereby greatly amplifying the SERS signal. When the surface density of the nanotips 14 formed on the base substrate 10 is less than 40/$\mu m^2$, effects of increasing the volume of 3D hotspots and amplifying the SERS signal may not be sufficient. On the other hand, when it is greater than 90/$\mu m^2$, it may be difficult to form the sharp nanotips being spaced apart, so that effects of increasing the volume of 3D hotspots and amplifying the SERS signal may be insignificant.

The nanodimples 12 and the nanotips 14 may be formed by ion beam treatment, plasma etching, soft lithography, nanoimprint lithography, or photo lithography, but it is not limited thereto. Preferably, the nanodimples 12 and the nanotips 14 may be formed by ion beam treatment. When the ion beam treatment is used to form the plasmonic nanodimples 22 of the plasmonic continuous film 20, it may be easy to form the plasmonic nanodimples 22 of the plasmonic continuous film 20 to have a depth-to-radius ratio of 1.5 or above and an inclination angle of a side surface of 30 to 60 degrees.

The ion beam may be an ion beam of oxygen, argon, krypton, xenon, nitrogen, hydrogen, or a mixture thereof, but it is not limited thereto. Preferably, it may be formed using an oxygen ion beam. When an oxygen ion beam treatment is used, it may be easy to form the plasmonic nanodimples 22 of the plasmonic continuous film 20 to have a depth-to-radius ratio of 1.5 or above and an inclination angle of a side surface of 30 to 60 degrees.

The plasmonic continuous film 20 is conformally coated on the base substrate 10, so that the plasmonic continuous film 20 has bowl-curved-shaped plasmonic nanodimples 22 and convex plasmonic nanotips 24 formed at contact points between the plasmonic nanodimples 22 at the same time.

Since the plasmonic continuous film 20 includes the bowl-curved-shaped plasmonic nanodimples 22 and the convex plasmonic nanotips 24 formed at contact points between the plasmonic nanodimples 22 at the same time, light may be focused inside the plasmonic nanodimples 22 due to 3D curvature effect and be concentrated at the sharp plasmonic nanotips 24 due to lightening rod effect of the plasmonic nanotips 24, which thus increases the total volume of hotspots, and significantly amplifies the SERS signal.

Since the depth-to-radius ratio of the plasmonic nanodimples 22 of the plasmonic continuous film 20 is 1.5 or above, incident light may be effectively focused inside the plasmonic nanodimples 22, thereby increasing the volume of 3D hotspots.

Since the inclination angle of the side surfaces of the plasmonic nanodimples 22 of the plasmonic continuous film 20 is 30 to 60 degrees, light may be focused due to the curvature of the nanodimples 22 and SERS performance may be greatly improved due to molecular concentration in the bowl-curved-shaped nanodimples 22.

Therefore, the substrate including the plasmonic continuous film having the above-described configuration of the present application may focus light incident into the plasmonic nanodimples 22 and onto the plasmonic nanotips 24, so that it is possible to provide a substrate for an ultrasensitive spectroscopic sensor that can increase the volume of 3D hotspots and concentrate and analyze a trace amount of a sample in the 3D hotspots.

A diameter of the plasmonic nanodimple 22 of the plasmonic continuous film 20 may be 10 nm to 100 nm, but it is not limited thereto. When the diameter of the plasmonic nanodimple 22 of the plasmonic continuous film 20 is less than 10 nm or greater than 100 nm, the effect of increasing the volume of 3D hotspots and amplifying the SERS signal may not be sufficient.

A surface density of the plasmonic nanodimples 22 of the plasmonic continuous film 20 may be 30/µm² to 80/µm², but it is not limited thereto. Due to such a configuration, it is possible to increase the volume of 3D hotspots, thereby greatly amplifying the SERS signal. When the surface density of the plasmonic nanodimples 22 formed on the plasmonic continuous film 20 is less than 30/µm², the effect of increasing the volume of 3D hotspots and amplifying the SERS signal may not be sufficient. On the other hand, when it is greater than 80/µm², it may be difficult to form a plasmonic continuous film with curved surface, resulting in forming a flat film, so that effects of increasing the volume of 3D hotspots and amplifying the SERS signal may be insignificant.

A surface density of the plasmonic nanotips 24 of the plasmonic continuous film 20 may be 40/µm² to 90/µm², but it is not limited thereto. Due to such a configuration, it is possible to increase the volume of 3D hotspots, thereby greatly amplifying the SERS signal. When the surface density of the plasmonic nanotips 24 formed on the plasmonic continuous film 20 is less than 40/µm², the effect of increasing the volume of 3D hotspots and amplifying the SERS signal may not be sufficient. On the other hand, when it is greater than 90/µm², it may be difficult to form the plasmonic nanotips being spaced apart, so that effects of increasing the volume of 3D hotspots and amplifying the SERS signal may be insignificant.

A thickness of the plasmonic continuous film 20 may be 10 nm to 200 nm, but it is not limited thereto. Due to such a configuration, it is possible to increase the volume of 3D hotspots, thereby greatly amplifying the SERS signal. When the thickness of the plasmonic continuous film 20 is less than 10 nm, LSPR cannot be generated. On the other hand, when it is greater than 200 nm, the nanodimples 22 are filled to form a flat substrate, and thus the effect of increasing the volume of 3D hotspots and amplifying the SERS signal may not be sufficient.

The plasmonic continuous film 20 may be formed by a vacuum deposition or a solution process. Various known vacuum deposition or solution processes may be used to form the plasmonic continuous film 20.

The plasmonic continuous film 20 may be a metal-containing thin film. The metal may be Au, Ag, Cu, Al, Pt, Pd, Ti, Rd, Ru, or an alloy thereof, but it is not limited thereto. Preferably, the metal may be Au or Ag.

The substrate may further include metal-containing nanoparticles formed on the metal-containing thin film. Due to such a configuration, a plurality of nanogaps such as nanogaps between the metal-containing thin film and the metal-containing nanoparticles and nanogaps between the metal-containing nanoparticles may be formed to significantly increase the volume of 3D hotspots and greatly amplify the SERS signal.

The substrate may further include an insulating layer and an additional metal-containing film formed on the metal-containing thin film. Due to such a configuration, a plurality of nanogaps such as nanogaps between the metal-containing film and the additional metal-containing thin film may be formed to significantly increase the volume of 3D hotspots, thereby greatly amplifying the SERS signal. The insulating layer may be formed of 1H, 1H, 2H, 2H-perfluorodecanethiol (PFDT), but it is not limited thereto.

According to another aspect, there is provided a method for manufacturing a substrate including a plasmonic continuous film, including: forming nanodimples and nanotips on a base substrate; and forming a plasmonic continuous film with curved surface on the base substrate, wherein the forming a plasmonic continuous film includes forming the plasmonic continuous film to have 1.5 or above of a depth-to-radius ratio of the nanodimple.

The step of forming nanodimples and nanotips may include irradiating gas particles in the energy of 500 eV or more to the base substrate made of a polymer. The gas particle irradiation for the high density polymer may easily form nanodimples by irradiating gas particles having energy of 500 eV or more.

In addition, the nanodimples may be formed inexpensively and largely without a mask. The large area may mean 50 cm² or greater, but is not limited thereto. On the other hand, the irradiation of the gas particles to the high density polymer may be irradiation of gas particles having energy of less than 500 eV to form nanowrinkles instead of nanodimples.

The polymer may have a density of 1.3 to 1.5 g/cm³, but it is not limited thereto. A reaction of the polymer by the energy delivered to a surface of the polymer may differ depending on the density of the polymer.

By irradiating gas particles having energy of 500 eV or more to the polymer having the above-defined density, the nanodimples and the nanotips may be efficiently formed by the process according to the present application.

The polymer may be polyethylene terephthalate (PET), polyimide (PI), polyethylene naphthalate (PEN), polyethersulfone (PES), or a mixture thereof, but it is not limited thereto.

The gas particles may be particles of oxygen, argon, krypton, xenon, nitrogen, hydrogen, or a mixture thereof, but it is not limited thereto. Preferably, the gas particles may be oxygen particles which are suitable for forming nanodimples and nanotips on the base substrate. When the oxygen particles collide with the polymer, a chemical reaction may become active along with a physical reaction, so that the uppermost polymer may be converted into a material such as $CO_x$ and $H_2O$ and etched to efficiently form nanodimples and nanotips on the base substrate. When mixed particles are used, 20% or more of oxygen particles may be used for forming nanodimples and nanotips on the base substrate.

The step of forming nanodimples and nanotips may include irradiating an ion beam having a dose of $2\times10^{17}$ ions/cm² or less, which is not limited thereto, on the base substrate made of a polymer. Due to such a configuration, it is possible to increase the volume of 3D hotspots, thereby greatly amplifying the SERS signal. When the ion beam dose exceeds $2\times10^{17}$ ions/cm², the surface density of the nanodimples and/or the nanotips may be less than 30/µm² and thus, effects of increasing the volume of 3D hotspots and amplifying the SERS signal may not be sufficient.

Hereinafter, exemplary embodiments of the present disclosure will be described in detail.

Example 1

1. Surface Treatment of a PEN Substrate Using Oxygen Ion Beam

In order to form nanodimples and nanotips on a flat polyethylene naphthalate (PEN) substrate, an ion beam treatment was performed under the following conditions.

Surface treatment with oxygen ion beam
Operating pressure: $10^{-2}$ torr
Energy of oxygen ion beam: 600 eV
Oxygen ion beam dose: $2.3 \times 10^{16}$ ions/cm² to $1.9 \times 10^{17}$ ions/cm²

FIGS. 4A, 4B, 4C, and 4D illustrate SEM images of a PEN polymer substrate including bowl-shaped nanodimples and spiked nanotips according to an embodiment of the present invention, in which the PEN polymer substrate including bowl-shaped nanodimples and spiked nanotips was formed by treating with oxygen ion beam dose $4.7 \times 10^{16}$ ions/cm² (FIG. 4A), $9.4 \times 10^{16}$ ions/cm² (FIG. 4B), $1.4 \times 10^{17}$ ions/cm² (FIG. 4C), $1.9 \times 10^{17}$ ions/cm² (FIG. 4D) on a flat PEN substrate. It was noted in the SEM images that bowl-shaped nanodimples and spiked nanotips were formed on all substrates with the oxygen ion beam treatment. It was noted that convexly elevated (spiked) nanotips were formed sharply at the contact points of nanodimples and nanodimples. It is further noted that as the oxygen ion dose increases, the diameter of the nanodimple gradually increases and the surface density of the nanodimples and nanotips decreases.

Figure 5A:
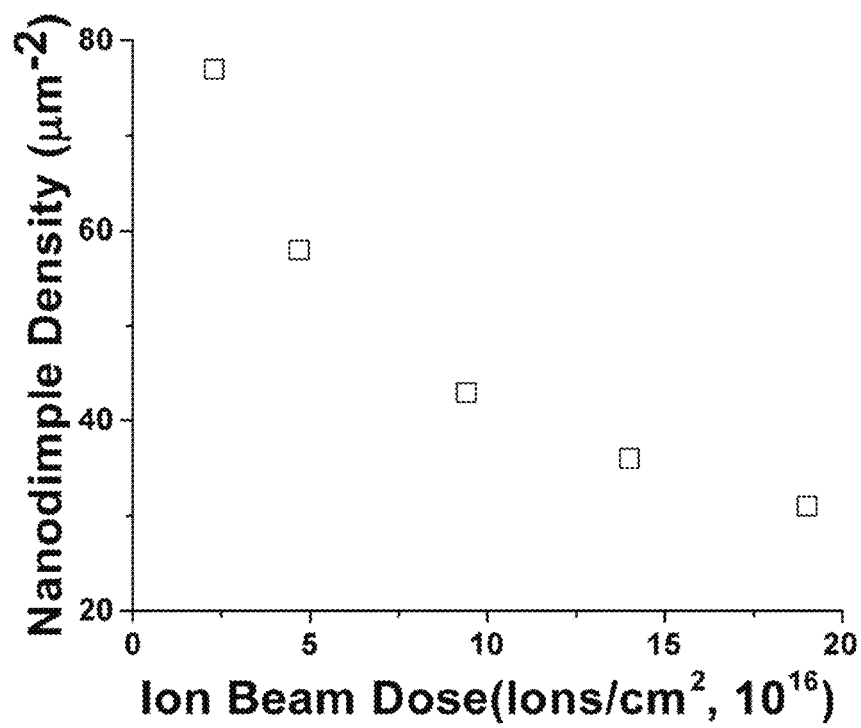
FIG. 5A is a graph illustrating a surface density of nanodimples of a polymer substrate depending on oxygen ion beam dose according to an embodiment of the present invention.
Figure 5B:
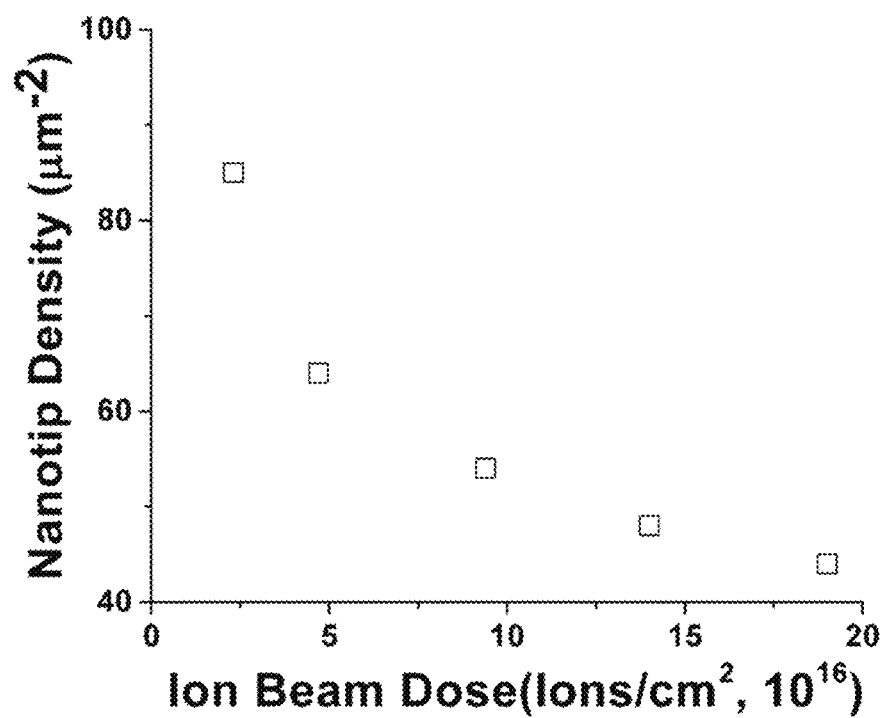
FIG. 5B is a graph illustrating a surface density of nanotips of a polymer substrate depending on oxygen ion beam dose according to an embodiment of the present invention.
Figure 6A:
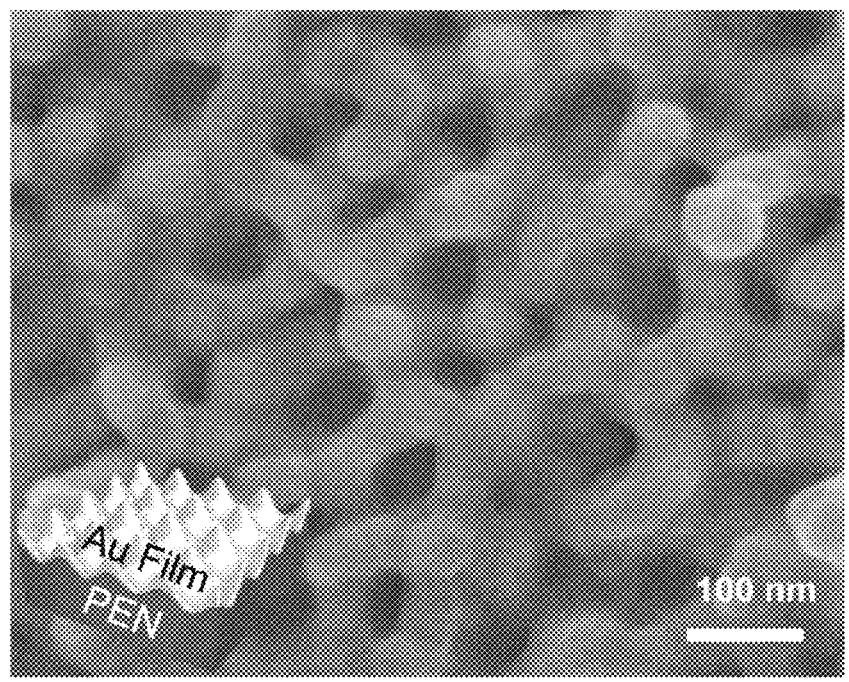
FIGS. 6A, 6B, 6C, 6D, 6E, 6F, 6G, 6H, and 6I illustrate SEM images of 100 nm thick Au vacuum deposited substrates on polymer substrates including nanodimples and nanotips formed by varying an oxygen ion beam dose according to an embodiment of the present invention.
Figure 6B:
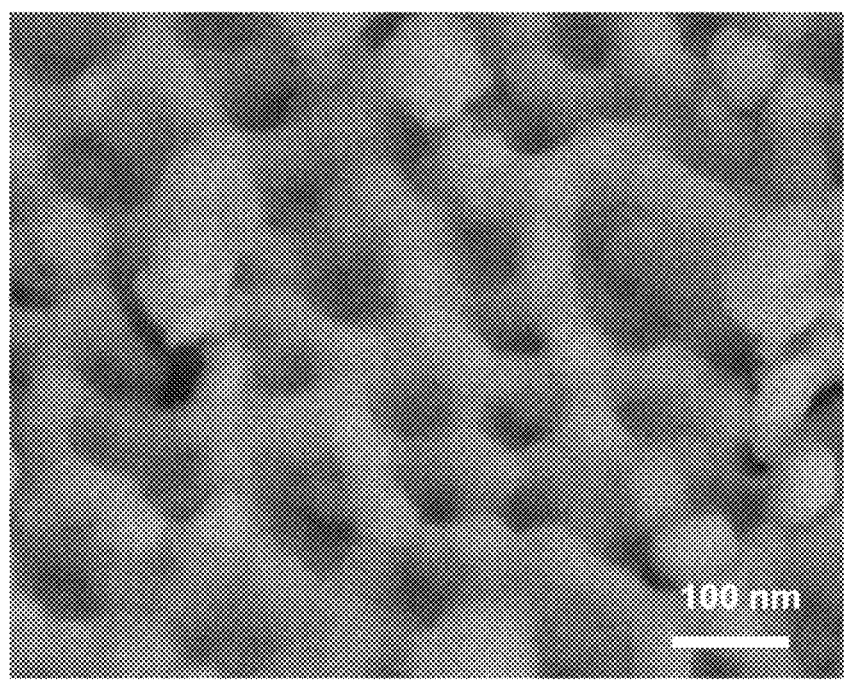
Figure 6C:
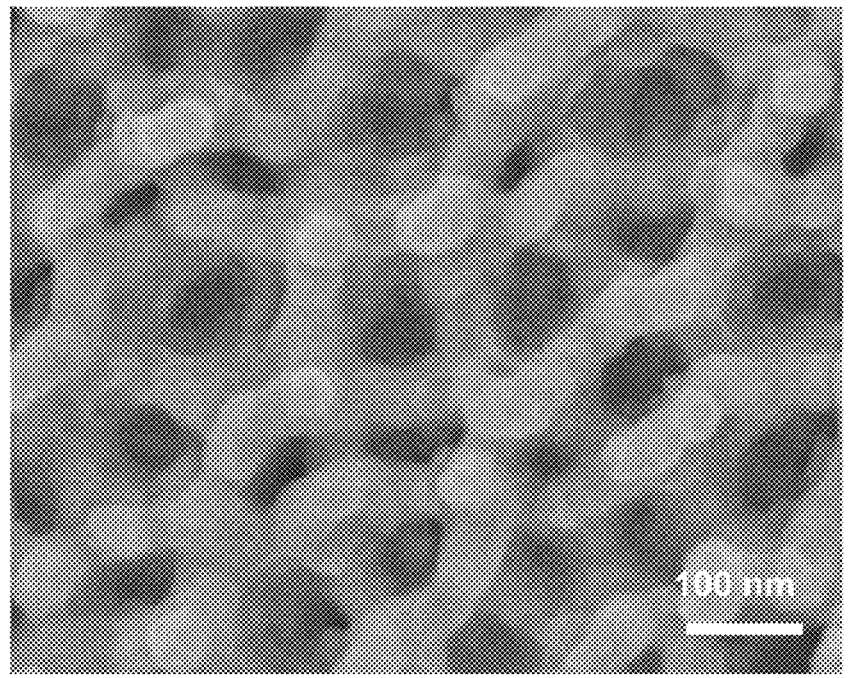
Figure 6D:
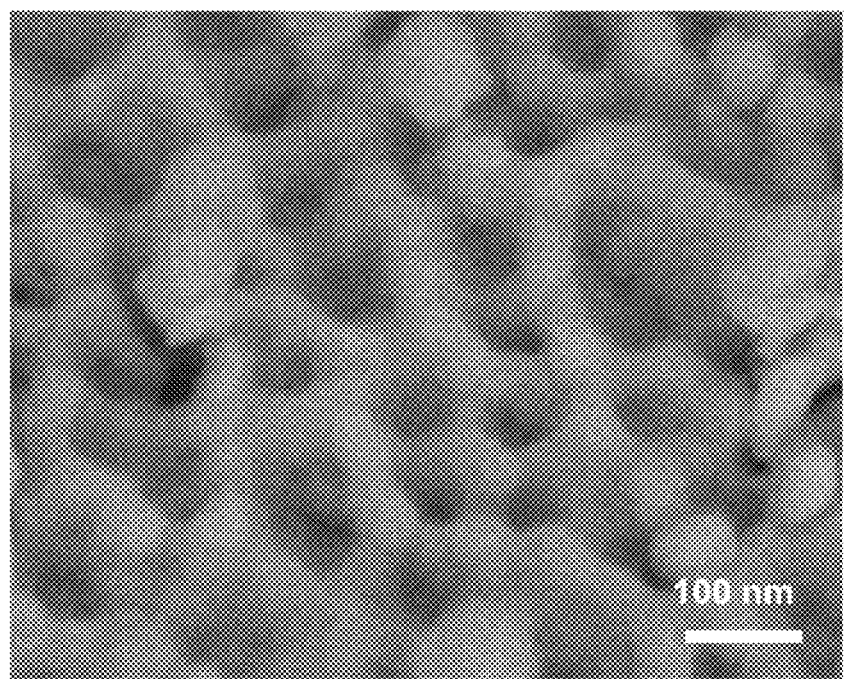
Figure 6E:
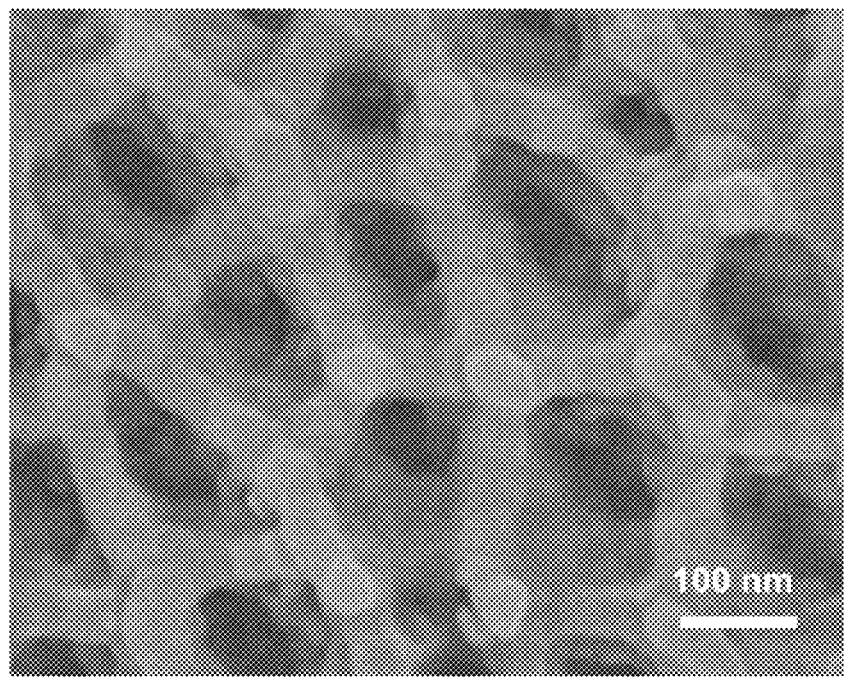
Figure 6F:
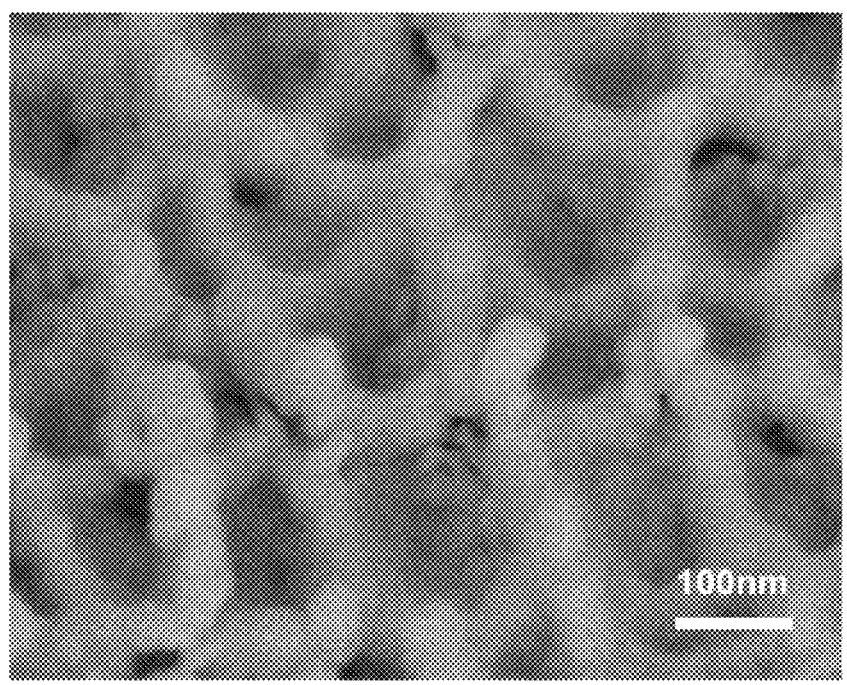
Figure 6G:
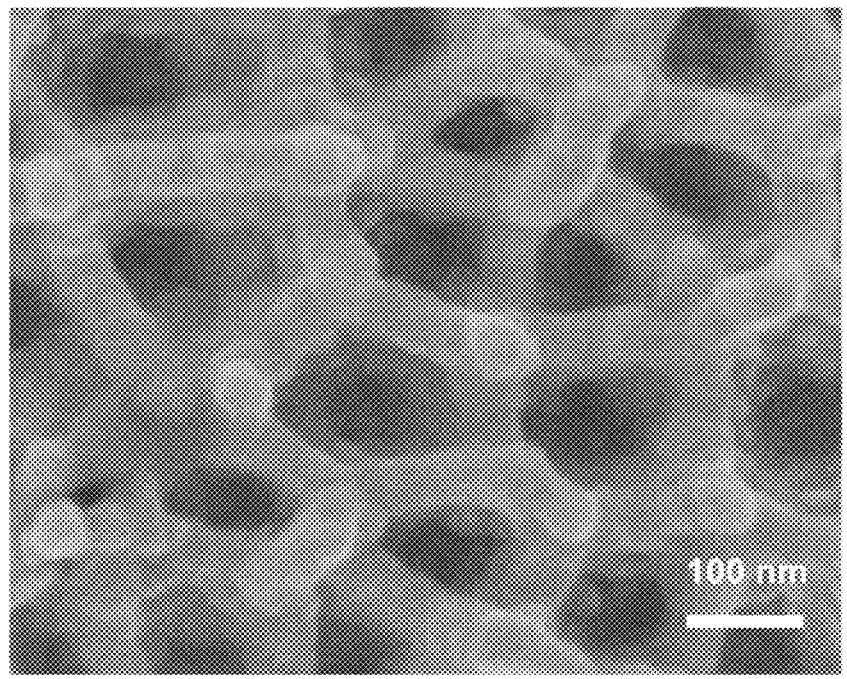
Figure 6H:
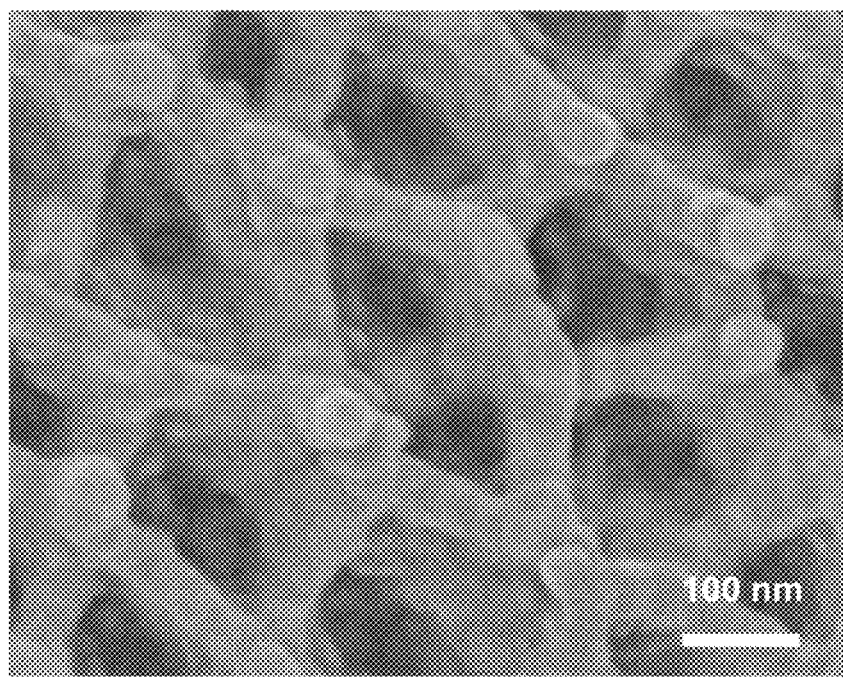
Figure 6I:
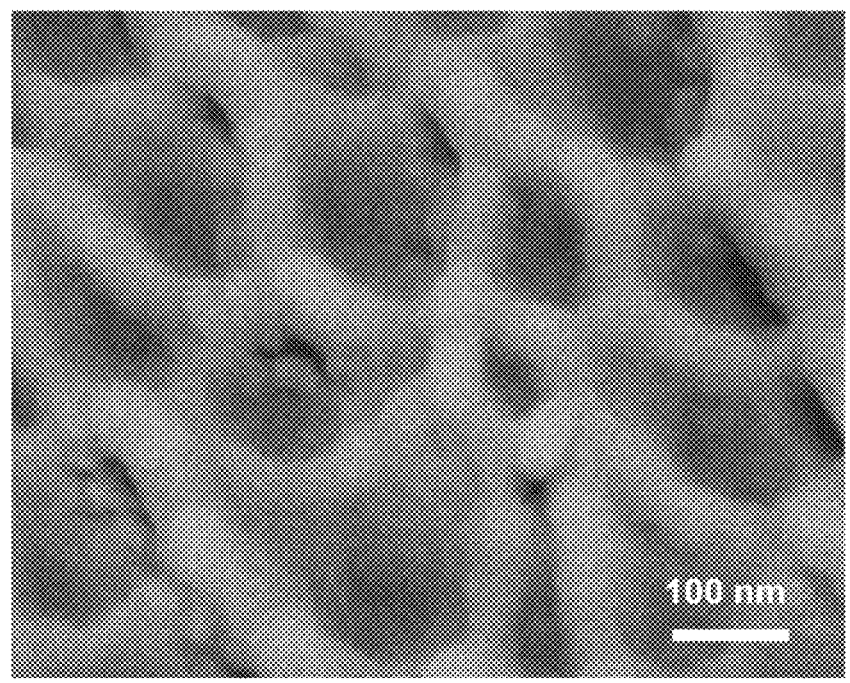

FIG. 5A is a graph illustrating a surface density of nanodimples of the polymer substrate depending on an oxygen ion beam dose, and FIG. 5B is a graph illustrating a surface density of nanotips of the polymer substrate depending on an oxygen ion beam dose. When nanodimples and nanotips were formed with oxygen ion beam dose of $2.3 \times 10^{16}$ ions/cm², the surface densities were 77/μm² and 85/μm², respectively. On the other hand, when nanodimples and nanotips were formed with oxygen ion beam dose of $1.9 \times 10^{17}$ ions/cm², the surface densities were significantly reduced to 31/μm² and 44/μm², respectively.

Example 2

1. Preparation of a Substrate Including Plasmonic Continuous Film with Curved Surface Au was vacuum-deposited on a PEN substrate including nanodimples and nanotips by thermal evaporation under the following conditions.

Au Thermal evaporation
Substrate: PEN polymer substrate treated by oxygen ion beam dose of $2.3 \times 10^{16}$ ions/cm² to $1.9 \times 10^{17}$ ions/cm²
Operating pressure: $5.0 \times 10^{-6}$ torr
Au deposition rate: 2.0 Å/s
Au deposition thickness: 100 nm FIGS. 6A, 6B, 6C, 6D, 6E, 6F, 6G, 6H, and 6I illustrate SEM images of 100 nm thick Au vacuum deposited substrates on polymer substrates including nanodimples and nanotips formed by varying an oxygen ion beam dose according to an embodiment of the present invention. It was confirmed by the SEM images that spike-shaped plasmonic Au nanotips were formed in the region where PEN nanotips were present, plasmonic Au nanodimples were formed in the region where the bowl-shaped PEN nanodimples were formed, and an Au continuous thin film with nanotips and nanodimples interconnected was formed. Although 100 nm thick Au was vacuum-deposited, neighboring nanotips existed independently without being connected to each other, so that there was no change in surface density of nanotips after 100 nm thick Au deposition.

Figure 7:
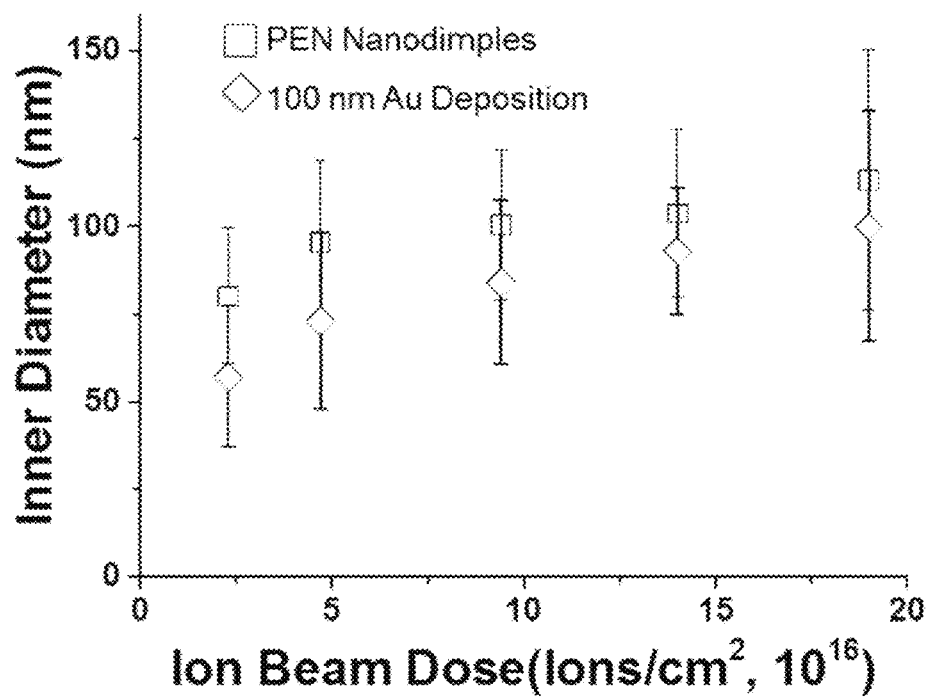
FIG. 7 is a graph illustrating differences in inner diameters of nanodimples of polymer substrates including nanodimples and nanotips formed by varying an oxygen ion beam dose from inner diameters of 100 nm thick Au vacuum deposited substrates on the polymer substrates according to an embodiment of the present invention.

FIG. 7 is a graph illustrating differences in inner diameters of nanodimples of polymer substrates including nanodimples and nanotips formed by varying an oxygen ion beam dose from inner diameters of 100 nm thick Au vacuum deposited substrates on the polymer substrates according to an embodiment of the present invention. It was noted that when 100 nm thick Au was vacuum-deposited, Au deposition was highly concentrated on the nanotips and thus, a deposition thickness of the nanotip area became greater than that of the nanodimple area. It was also noted that due to conformal Au deposition on the side surfaces sloped at 30 degrees to 60 degrees, when 100 nm thick Au was vacuum-deposited, the inner diameters were reduced by 10 nm to 20 nm compared with the inner diameters of the PEN nanodimples.

Figure 8A:
FIGS. 8A, 8B, and 8C are cross-sectional SEM images of Au continuous thin films after 100 nm thick Au vacuum deposition on a polymer substrate treated with an oxygen ion beam dose of 4.7×10¹⁶ ions/cm² according to an embodiment of the present invention.
Figure 8B:
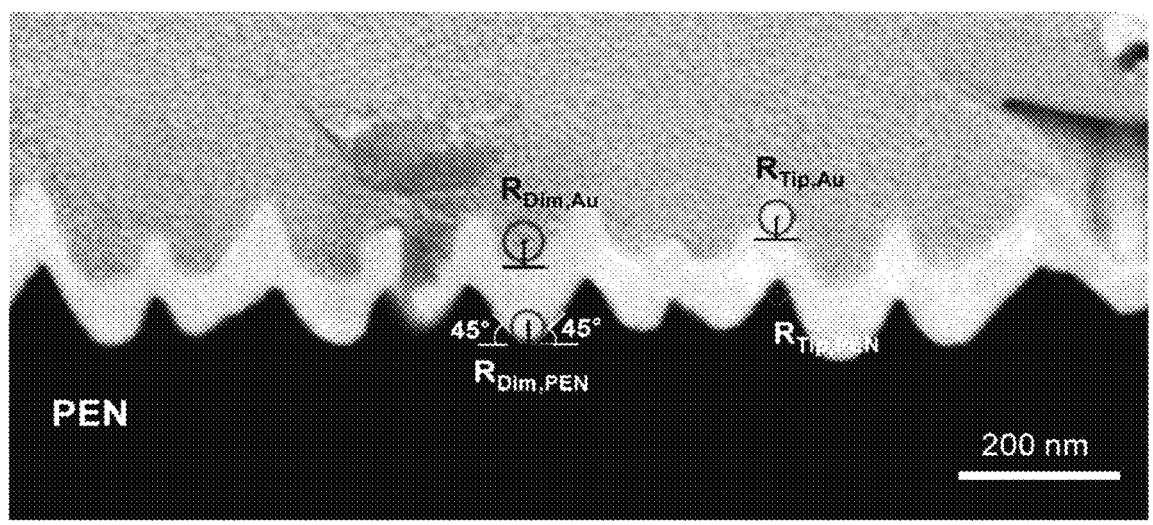
Figure 8C:
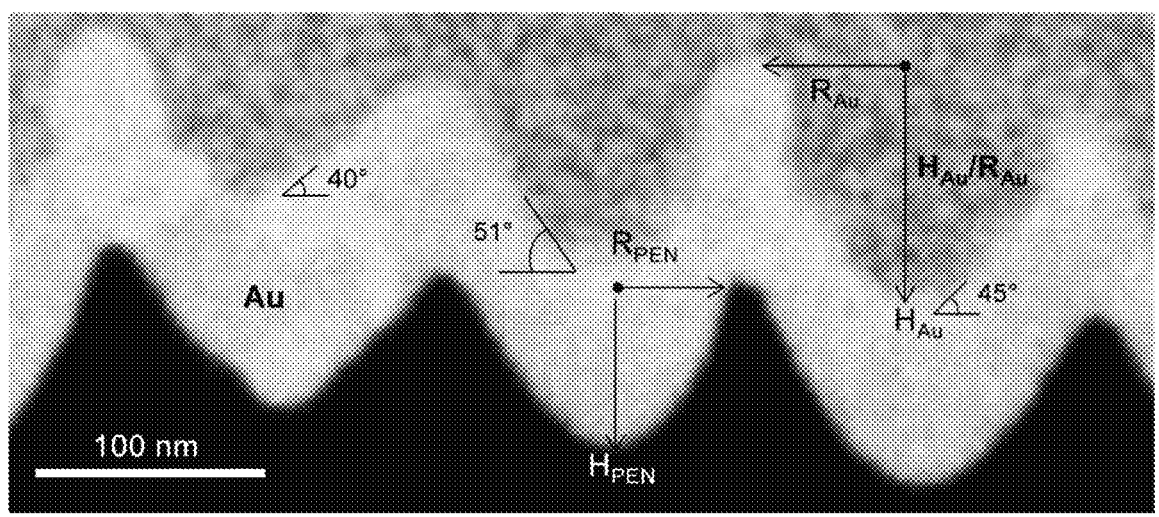

FIGS. 8A, 8B, and 8C are cross-sectional SEM images of Au continuous thin films after 100 nm thick Au vacuum deposition on a polymer substrate treated with an oxygen ion beam dose of $4.7 \times 10^{16}$ ions/cm² according to an embodiment of the present invention. After cutting the cross section of the substrate through a focused ion beam (FIB) process, SEM was measured. It was confirmed in FIG. 8A that an Au film was formed as a continuous thin film on black bowl-shaped PEN nanodimples and spike-shaped PEN nanotips. It was confirmed in FIGS. 8B and 8C that the side surfaces of the PEN nanodimples were not vertical but inclined by 30 degrees to 60 degrees, and the Au nanodimples deposited on the PEN nanodimples were also inclined by 30 degrees to 60 degrees. Since the inclination angle of the side surface of the polymer nanodimples was 30 degrees to 60 degrees, Au could also be conformally deposited on the inclined side surfaces during the Au vacuum deposition and plasmonic Au nanodimple structures similar to the polymer nanodimple structures could be formed.

It was noted that the PEN nanotips exhibited a very large convex curvature (103.1 μm⁻¹), or very sharp tip, with an average radius of curvature ($R_{Tip,PEN}$) of 9.7 nm, while the PEN nanodimples exhibited bowl-shaped concave curvature (−33.1 μm⁻¹), or a negative curvature value, with an average radius of curvature ($R_{Dim,PEN}$) of 30.2 nm. It was also noted that after 100 nm Au thermal evaporation, curvature ($R_{Tip,Au}$) of the upper Au nanotips (54.3 μm⁻¹) was smaller compared to that of the sharp PEN nanotips (103.1 μm⁻¹), while curvature ($R_{Dim,Au}$) of Au nanodimples (−29.0 μm⁻¹) was similar to that of PEN nanodimples (−33.1 μm⁻¹) since conformal deposition is made in the nanodimple area.

Figure 9A:
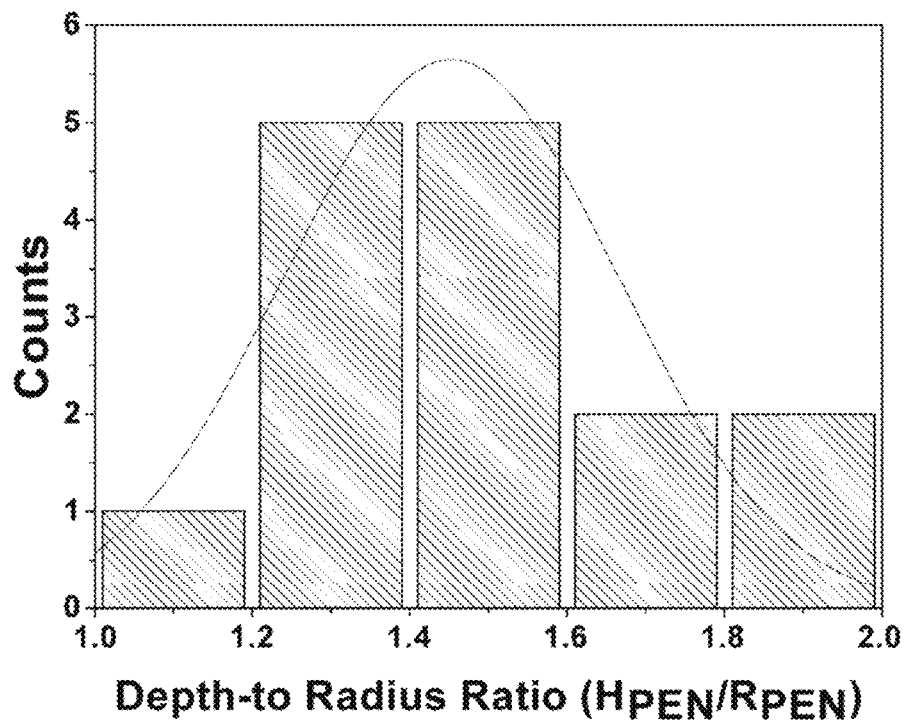
FIG. 9A is a graph illustrating a depth-to-radius ratio of nanostructure of a polymer substrate treated with an oxygen ion beam dose of 4.7×10¹⁶ ions/cm² according to an embodiment of the present invention.
Figure 9B:
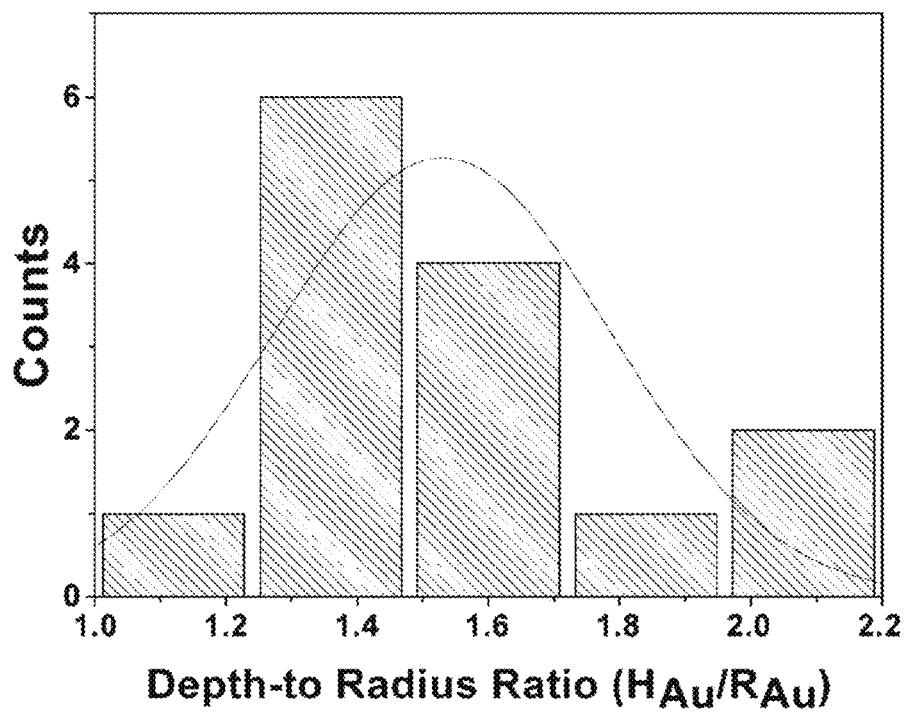
FIG. 9B is a graph illustrating a depth-to-radius ratio of nanostructure of an Au substrate after 100 nm thick Au vacuum deposition on a polymer substrate treated with an oxygen ion beam dose of 4.7×10¹⁶ ions/cm² according to an embodiment of the present invention.

FIG. 9A is a graph illustrating a depth-to-radius ratio of nanostructure of a polymer substrate treated with an oxygen ion beam dose of $4.7 \times 10^{16}$ ions/cm² according to an embodiment of the present invention, and FIG. 9B is a graph illustrating a depth-to-radius ratio of nanostructure of an Au substrate after 100 nm thick Au vacuum deposition on a polymer substrate treated with an oxygen ion beam dose of $4.7 \times 10^{16}$ ions/cm² according to an embodiment of the present invention. The depth-to-radius ratio of nanostructures of FIG. 9A and FIG. 9B could be obtained by directly measuring the depth-to-radius ratio ($H_{PEN}/R_{PEN}$) of the PEN nanostructure and the depth-to-radius ratio ($H_{Au}/R_{Au}$) of the Au nanostructure through FIG. 8C. The depth-to-radius ratios of the PEN nanostructure and the Au nanostructure were 1.45 and 1.53, respectively. It may be determined that an actual depth-to-radius ratio of the Au nanostructure may be greater than 1.5 because it is very difficult to cut exactly into the line passing through the middle between tips of the nanostructure during the FIB process.

Figure 10A:
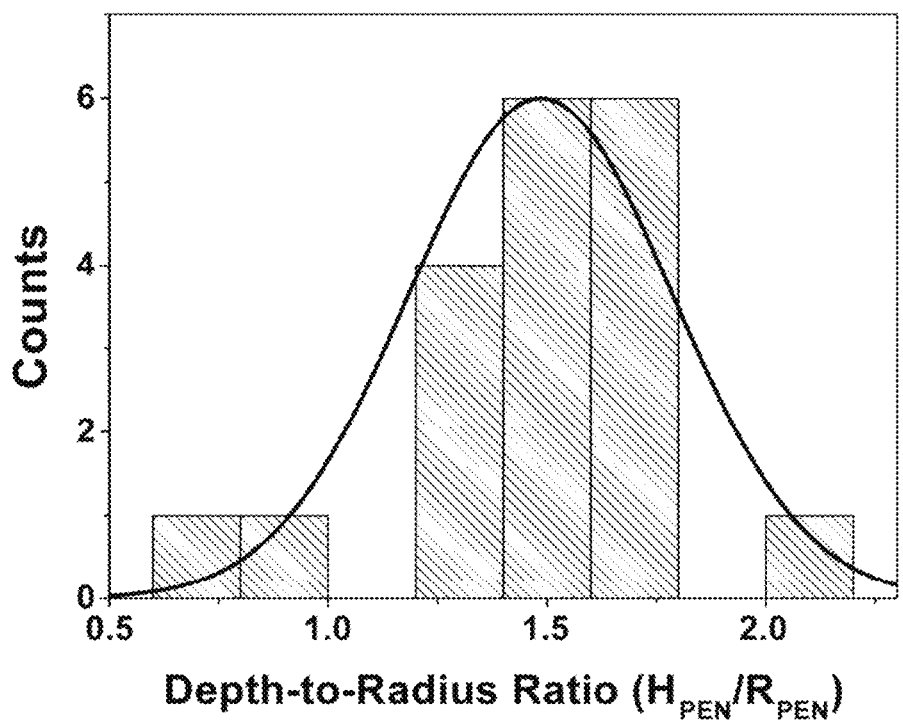
FIG. 10A is a graph illustrating a depth-to-radius ratio of nanostructure of a polymer substrate treated with an oxygen ion beam dose of 9.4×10¹⁶ ions/cm² according to an embodiment of the present invention.
Figure 10B:
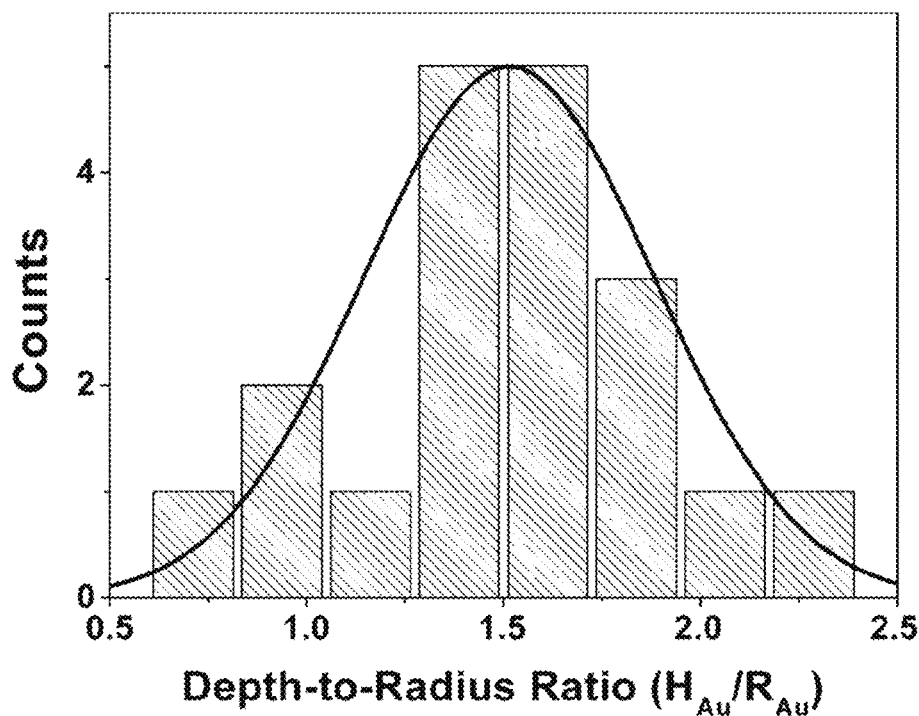
FIG. 10B is a graph illustrating a depth-to-radius ratio of nanostructure of an Au substrate after 100 nm thick Au vacuum deposition on a polymer substrate treated with an oxygen ion beam dose of $9.4 \times 10^{16}$ ions/cm$^2$ according to an embodiment of the present invention.

FIG. 10A is a graph illustrating a depth-to-radius ratio of nanostructure of a polymer substrate treated with an oxygen ion beam dose of $9.4 \times 10^{16}$ ions/cm$^2$ according to an embodiment of the present invention, and FIG. 10B is a graph illustrating a depth-to-radius ratio of nanostructure of an Au substrate after 100 nm thick Au vacuum deposition on a polymer substrate treated with an oxygen ion beam dose of $9.4 \times 10^{16}$ ions/cm$^2$ according to an embodiment of the present invention. It was noted that even if the oxygen ion beam dose was greatly increased, the depth-to-radius ratios of the PEN and Au nanostructures were not changed significantly, of which depth-to-radius ratios of PEN and Au nanostructures were 1.48 and 1.51, respectively. When etching occurs on the substrate by oxygen ion beam, etching occurred isotropically because the physical etching effect of accelerated oxygen ions by an applied voltage and the chemical etching effect by oxygen ions occurred simultaneously. Due to such physical/chemical etching effects, the depth-to-radius ratio did not change significantly depending on the oxygen ion beam dose.

Comparative Example 1

1. Surface Treatment of a PEN Substrate Using Argon Ion Beam

Figure 11A:
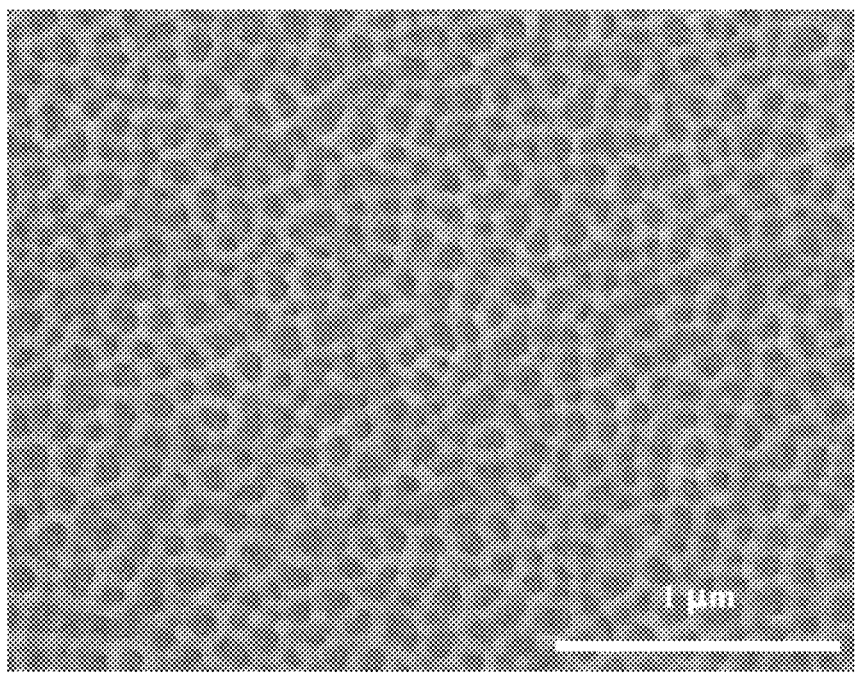
FIGS. 11A, 11B, 11O, and 11D are SEM and AFM images of Au substrates after 100 nm thick Au vacuum deposition on a polymer substrate treated with an argon ion beam dose of $1.0 \times 10^{17}$ ions/cm$^2$ according to a comparative embodiment of the present invention.
Figure 11B:
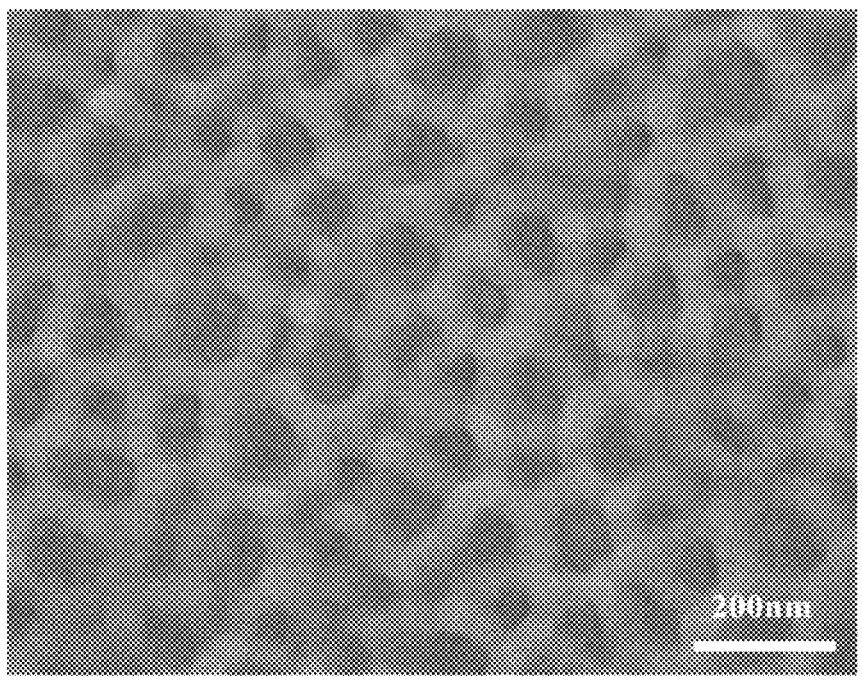
Figure 11C:
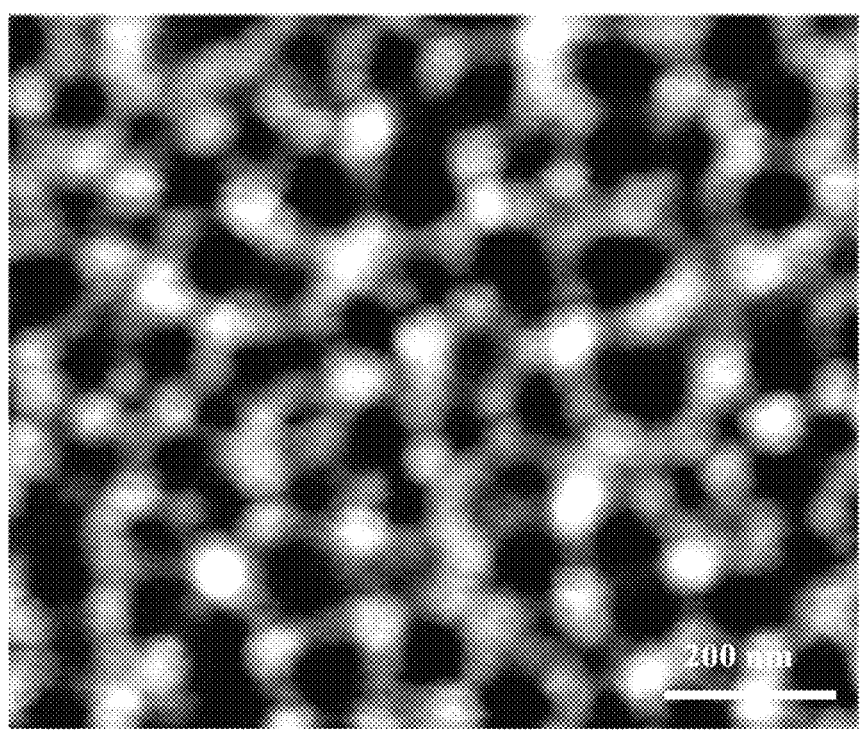
Figure 11D:
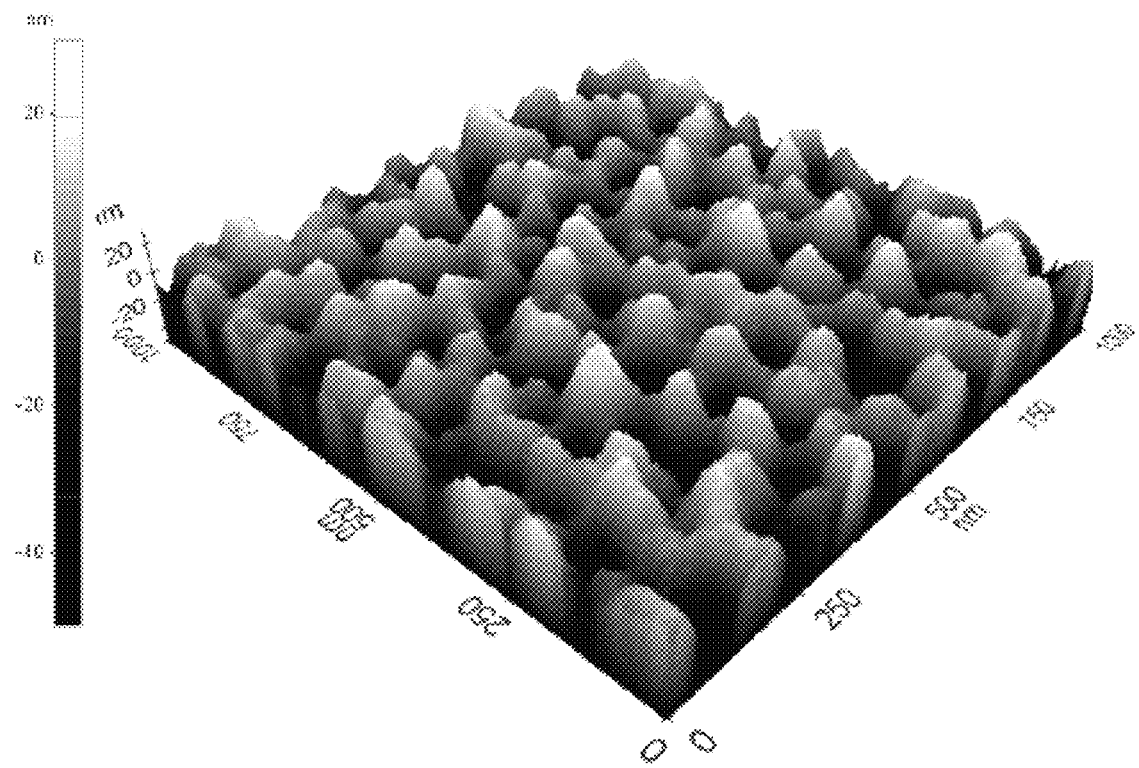

In order to form nanodimples and nanotips on a flat polyethylene naphthalate (PEN) substrate, an ion beam treatment was performed under the following conditions.
Surface treatment with argon ion beam
Operating pressure: $10^{-2}$ torr
Energy of argon ion beam: 600 eV
Argon ion beam dose: $1.0 \times 10^{17}$ ions/cm$^2$ to $1.5 \times 10^{17}$ ions/cm$^2$ FIGS. 11A, 11B, 11O, and 11D are SEM and AFM images of Au substrates after 100 nm thick Au vacuum deposition on a polymer substrate treated with an argon ion beam dose of $1.0 \times 10^{17}$ ions/cm$^2$ according to a comparative example of the present invention. It was noted that as in the case of surface treatment with oxygen ion beam, high density nanodimple and nanotip arrays were formed. As shown in FIG. 11D, unlike the PEN substrate treated with oxygen ion beam, a continuous plasmonic thin film having a depth-to-radius ratio of nanodimples of less than 1 was formed when treated with argon ion beam. Unlike the oxygen ion beam, only physical etching occurred with the argon ion beam, so nanodimples with a smaller depth-to-radius ratio were formed.

Figure 12A:
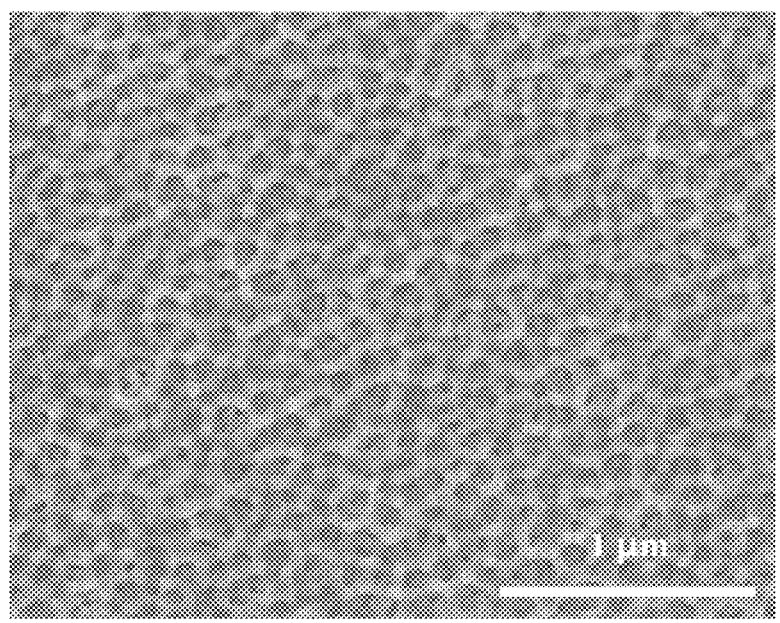
FIGS. 12A and 12B are SEM images of Au substrates after 100 nm thick Au vacuum deposition on a polymer substrate treated with an argon ion beam dose of $1.5 \times 10^{17}$ ions/cm$^2$ according to a comparative embodiment of the present invention.
Figure 12B:
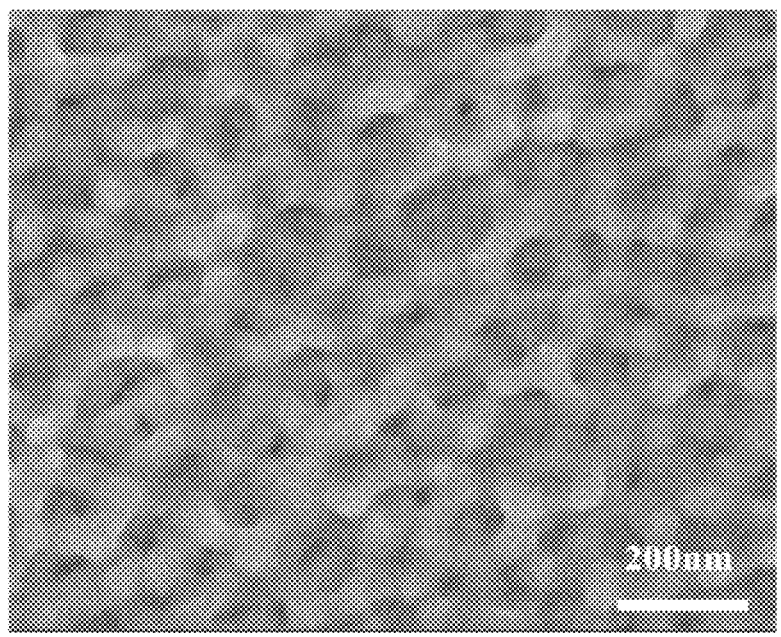

FIGS. 12A and 12B are SEM images of Au substrates after 100 nm thick Au vacuum deposition on a polymer substrate treated with an argon ion beam dose of $1.5 \times 10^{17}$ ions/cm$^2$ according to a comparative example of the present invention. It was noted that as the argon ion beam dose increased, a diameter of the nanodimples became larger and a surface density decreased.

Example 3

Figure 13A:
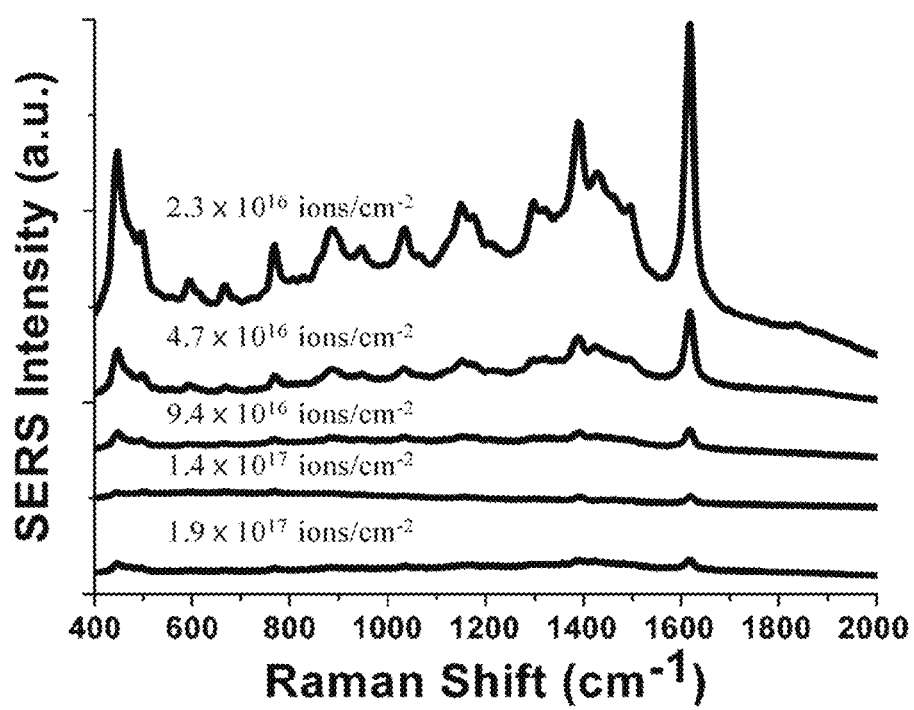
FIG. 13A is a graph illustrating comparison of SERS signals measured at a wavelength of 638 nm of a substrate including a plasmonic continuous film, which is formed by 100 nm thick Au vacuum deposition on a polymer substrate treated with an oxygen ion beam dose of $2.3 \times 10^{16}$ ions/cm$^2$ to $1.9 \times 10^{17}$ ions/cm$^2$ and on which 3 μL of 5 μM methylene blue solution is dropped and dried.
Figure 13B:
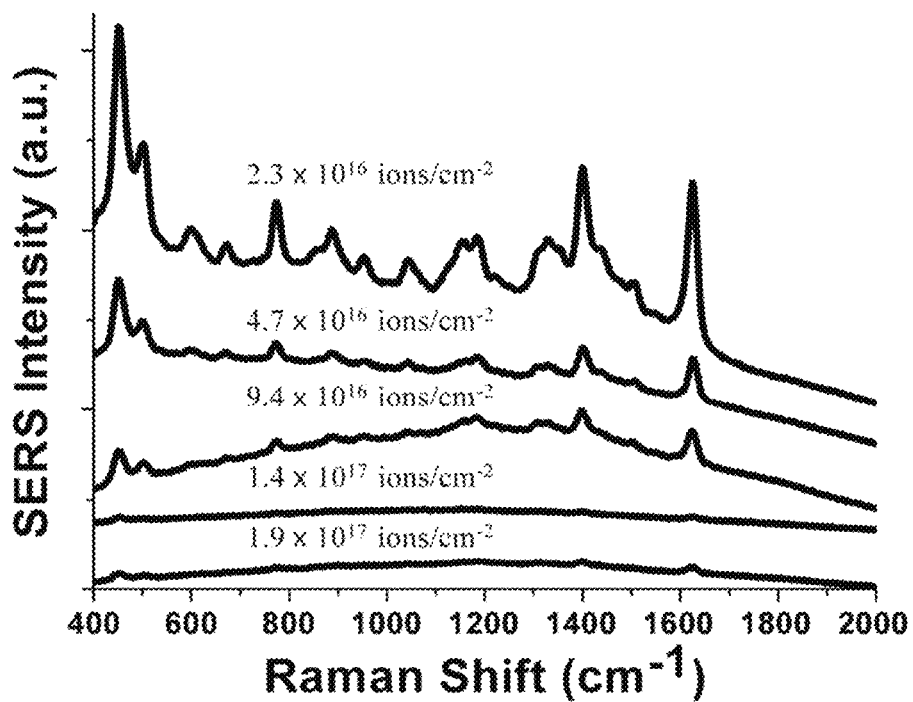
FIG. 13B is a graph illustrating comparison of SERS signals measured at a wavelength of 785 nm of a substrate including a plasmonic continuous film, which is formed by 100 nm thick Au vacuum deposition on a polymer substrate treated with an oxygen ion beam dose of $2.3 \times 10^{16}$ ions/cm$^2$ to $1.9 \times 10^{17}$ ions/cm$^2$ and on which 3 μL of 5 μM methylene blue solution is dropped and dried.

1. Preparation of a Substrate Including a Plasmonic Continuous Film Depending on Oxygen Ion Beam Dose FIG. 13A is a graph illustrating comparison of SERS signals measured at a laser wavelength of 638 nm of a substrate including a plasmonic continuous film, which is formed by 100 nm thick Au vacuum deposition on a polymer substrate treated with an oxygen ion beam dose of $2.3 \times 10^{16}$ ions/cm$^2$ to $1.9 \times 10^{17}$ ions/cm$^2$ and on which 3 µL of 5 µM methylene blue solution is dropped and dried. FIG. 13B is a graph illustrating comparison of SERS signals measured at a laser wavelength of 785 nm of a substrate including a plasmonic continuous film, which is formed by 100 nm thick Au vacuum deposition on a polymer substrate treated with an oxygen ion beam dose of $2.3 \times 10^{16}$ ions/cm$^2$ to $1.9 \times 10^{17}$ ions/cm$^2$ and on which 3 µL of 5 µM methylene blue solution is dropped and dried.

The measurement conditions in this example are as follows.
Excitation laser wavelength: 638 nm (FIG. 13A) and 785 nm (FIG. 13B)
Laser power: 10 mW
Laser spot size: 20 µm The largest SERS signal was shown when the oxygen ion beam dose $2.3 \times 10^{16}$ ions/cm$^2$ in excitation laser wavelength of 638 nm (FIG. 13A) and 785 nm (FIG. 13B). It was confirmed that since the surface density of plasmonic nanodimples and nanotips was the largest and thus the density of 3D hotspots was the highest, the largest SERS signal was shown when the oxygen ion beam dose was $2.3 \times 10^{16}$ ions/cm$^2$.

Figure 14A:
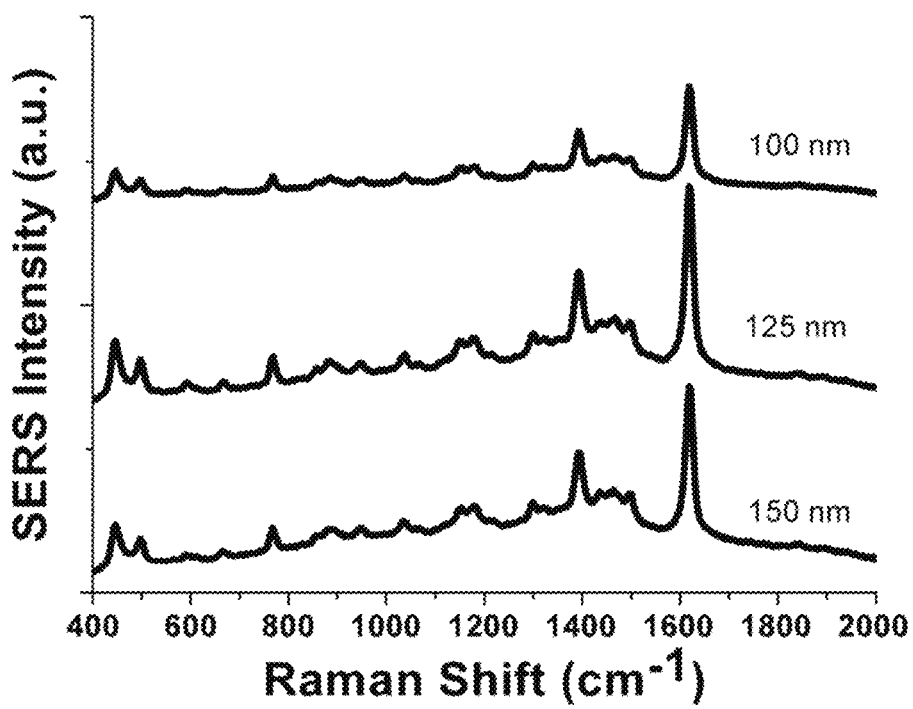
FIG. 14A is a graph illustrating comparison of SERS signals measured at a wavelength of 638 nm of a substrate including a plasmonic continuous film, which is formed by treating an oxygen ion beam dose of $2.3 \times 10^{16}$ ions/cm$^2$ and 100 nm-, 125 nm-, and 150 nm-thick Au vacuum deposition and on which 3 μL of 5 μM methylene blue solution is dropped and dried.
Figure 14B:
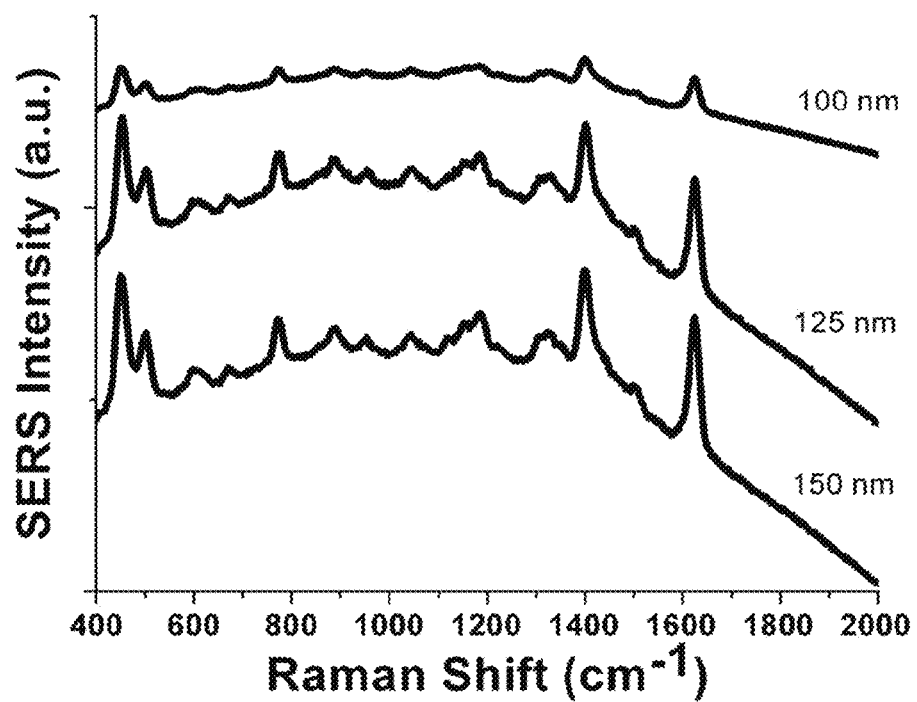
FIG. 14B is a graph illustrating comparison of SERS signals measured at a wavelength of 785 nm of a substrate including a plasmonic continuous film, which is formed by treating an oxygen ion beam dose of $2.3 \times 10^{16}$ ions/cm$^2$ and 100 nm-, 125 nm-, and 150 nm-thick Au vacuum deposition and on which 3 μL of 5 μM methylene blue solution is dropped and dried.

FIG. 14A is a graph illustrating comparison of SERS signals measured at a laser wavelength of 638 nm of a substrate including a plasmonic continuous film, which is formed by treating an oxygen ion beam dose of $2.3 \times 10^{16}$ ions/cm$^2$ and 100 nm-, 125 nm-, and 150 nm-thick Au vacuum deposition and on which 3 µL of 5 µM methylene blue solution is dropped and dried. FIG. 14B is a graph illustrating comparison of SERS signals measured at a laser wavelength of 785 nm of a substrate including a plasmonic continuous film, which is formed by treating an oxygen ion beam dose of $2.3 \times 10^{16}$ ions/cm$^2$ and 100 nm-, 125 nm-, and 150 nm-thick Au vacuum deposition and on which 3 µL of 5 µM methylene blue solution is dropped and dried. The SERS substrate with vacuum deposition of 125 nm thick Au showed the highest intensity at a laser wavelength of 638 nm, and the SERS substrate with 150 nm thick Au vacuum deposition showed the highest intensity at a laser wavelength of 785 nm.

Figure 15A:
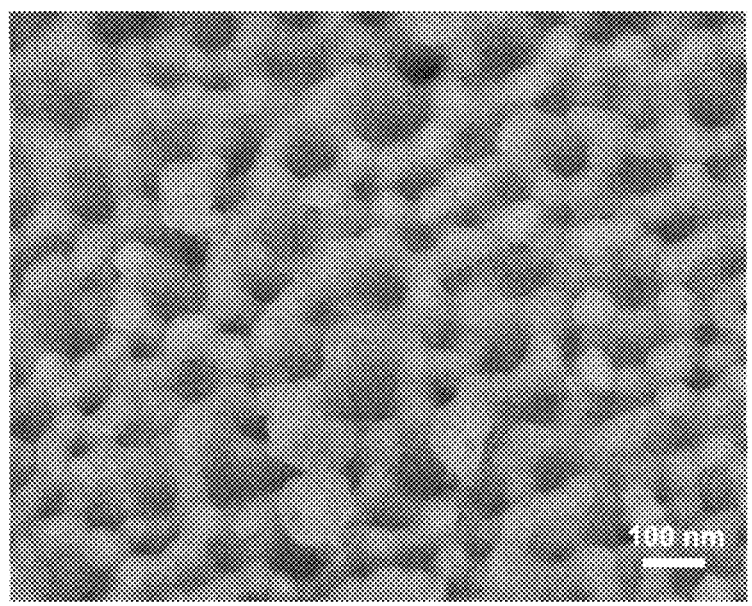
FIG. 15A and FIG. 15B are SEM images of an Au substrate structure treated with an oxygen ion beam dose of $2.3 \times 10^{16}$ ions/cm$^2$ and 125 nm thick vacuum deposition according to an embodiment of the present invention.
Figure 15B:
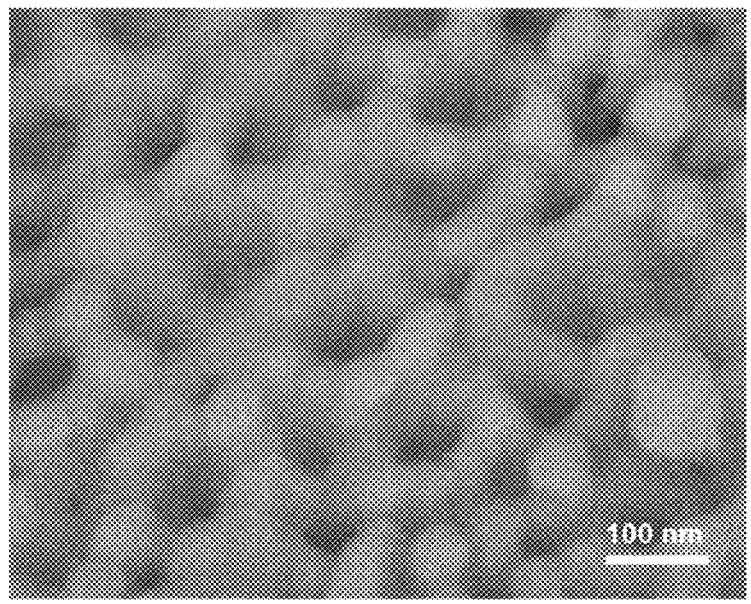
Figure 15C:
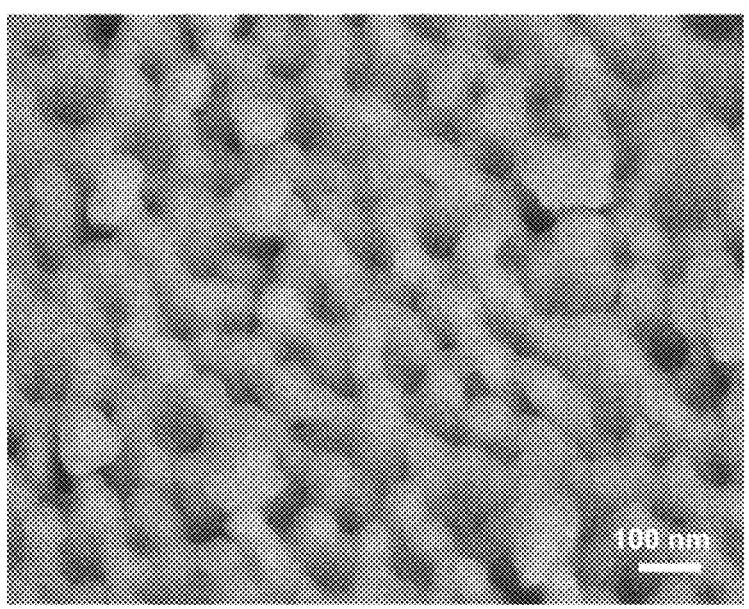
FIG. 15C and FIG. 15D are SEM images of an Au substrate structure treated with an oxygen ion beam dose of $2.3 \times 10^{16}$ ions/cm$^2$ and 150 nm thick vacuum deposition according to an embodiment of the present invention.
Figure 15D:
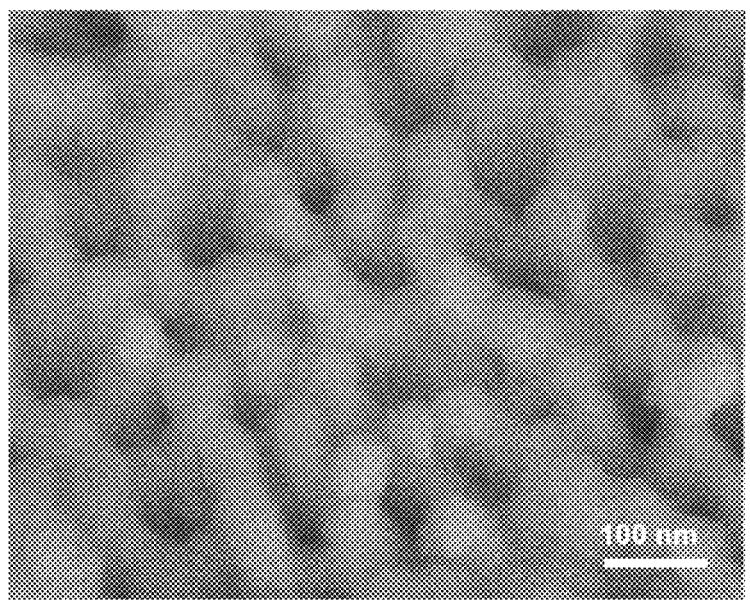

FIG. 15A and FIG. 15B are SEM images of an Au substrate structure treated with an oxygen ion beam dose of $2.3 \times 10^{16}$ ions/cm$^2$ and 125 nm thick vacuum deposition according to an embodiment of the present invention. FIG. 15C and FIG. 15D are SEM images of an Au substrate structure treated with an oxygen ion beam dose of $2.3 \times 10^{16}$ ions/cm$^2$ and 150 nm thick vacuum deposition according to an embodiment of the present invention. It was noted that Au nanodimples and nanotips were mixed independently even after 125 nm thick vacuum deposition (FIG. 15A and FIG. 15B) and 150 nm thick vacuum deposition (FIG. 15C and FIG. 15D). As the Au deposition thickness increased, the distance between the nanotips decreased to induce plasmonic coupling due to nanogaps, and the SERS characteristic was greatly improved by this plasmonic coupling effect.

Example 4

Figure 16A:
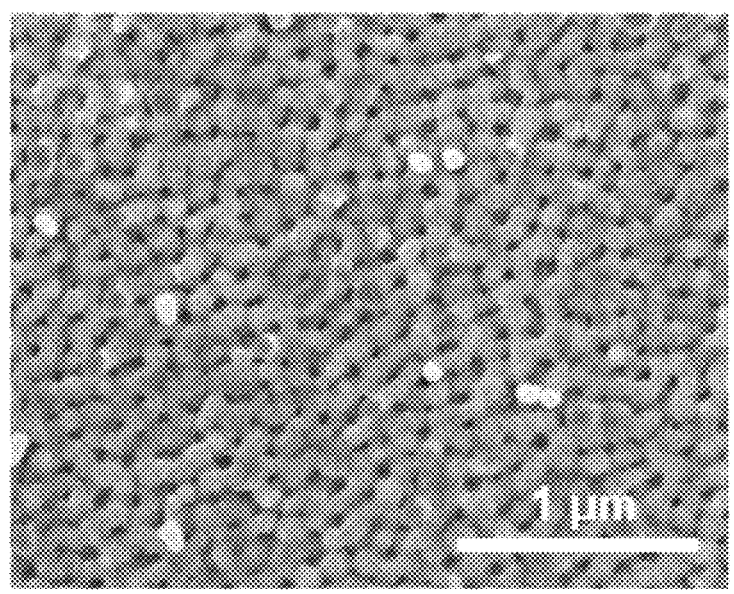
FIG. 16A and FIG. 16B are SEM images of an Au substrate structure treated with an oxygen ion beam dose of $2.3 \times 10^{16}$ ions/cm$^2$ and 125 nm thick vacuum deposition according to an embodiment of the present invention.
Figure 16B:
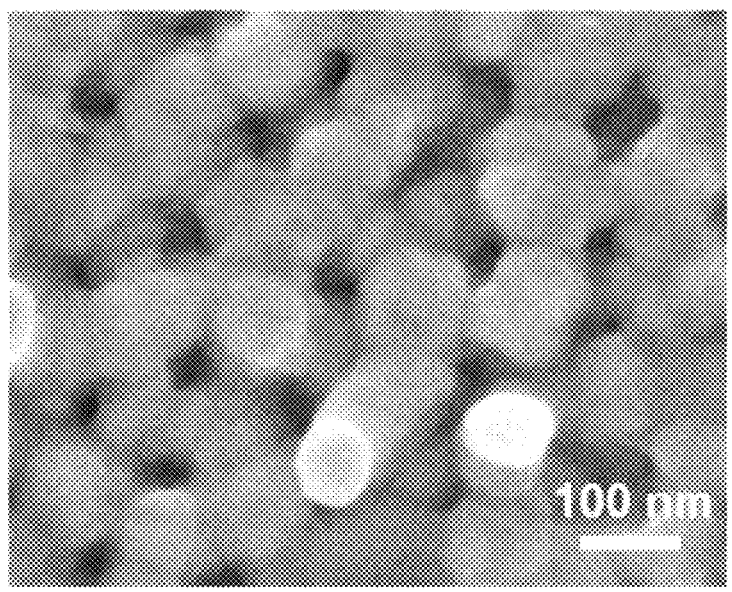

1. Preparation of a Substrate Including an Ag Continuous Thin Film with Curved Surface Ag was vacuum-deposited on a PEN substrate including nanodimple and nanotip arrays by thermal evaporation under the following conditions.
Ag Thermal evaporation
Substrate: PEN polymer substrate treated with oxygen ion beam dose of $2.3 \times 10^{16}$ ions/cm$^2$
Operating pressure: $5.0 \times 10^{-6}$ torr Ag deposition rate: 2.0 Å/s
Ag deposition thickness: 125 nm FIG. 16A and FIG. 16B are SEM images of an Ag substrate structure treated with an oxygen ion beam dose of $2.3\times10^{16}$ ions/cm$^2$ and 125 nm thick vacuum deposition according to an embodiment of the present invention. When Ag, which has a lower surface energy than Au, was deposited on the PEN substrate including nanodimples and nanotips, Ag tended to form a thinner film. It was confirmed that as shown in FIG. 15A and FIG. 15B in which 125 nm thick Au was deposited, Au nanotips were spaced apart from each other, whereas Ag nanotips were connected to each other due to low surface energy. It was also confirmed that Au and Ag, which are representative plasmonic materials, formed a plasmonic continuous film with curved surface.

Example 5

1. Preparation of a substrate including an Ag—Au continuous thin film

Ag and Au were vacuum-deposited on a PEN substrate including nanodimple and nanotip arrays by vacuum deposition under the following conditions.

Figure 17A:
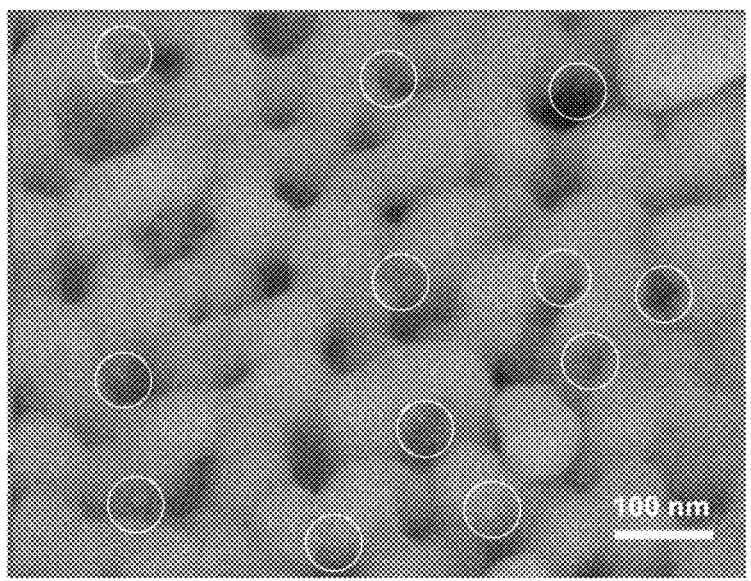
FIG. 17A and FIG. 17B are SEM images of a substrate structure including a plasmonic continuous film, which is formed by treating with an oxygen ion beam dose of $2.3 \times 10^{16}$ ions/cm$^2$ and continuous Ag 125 nm- and Au 10 nm-thick vacuum deposition, and on which 3 μL of 5 μM methylene blue solution is dropped and dried according to an embodiment of the present invention.
Figure 17B:
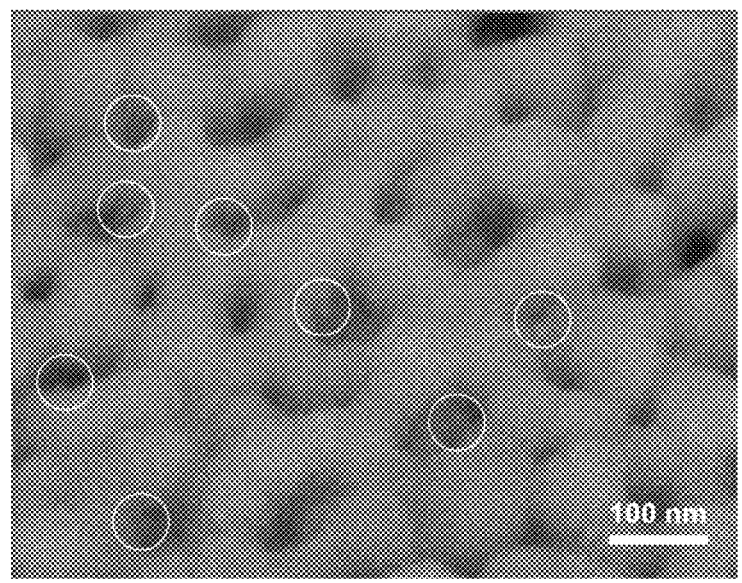

Ag Thermal evaporation
  Substrate: PEN polymer substrate treated with oxygen ion beam dose $2.3\times10^{16}$ ions/cm$^2$
  Operating pressure: $5.0\times10^{-6}$ torr
  Ag deposition rate: 2.0 Å/s
  Ag deposition thickness: 125 nm
Au Sputtering process
  Operating pressure: $7.0\times10^{-2}$ torr
  Operation gas: Ar 20 sccm
  RF plasma power: 100 W
  Au deposition rate: 2.0 Å/s
  Au deposition thickness: 10 nm FIG. 17A and FIG. 17B are SEM images of a substrate structure including a plasmonic continuous film, which is formed by treating with an oxygen ion beam dose of $2.3\times10^{16}$ ions/cm$^2$ and continuous Ag 125 nm thick and Au 10 nm thick vacuum deposition, and on which 3 μL of 5 μM methylene blue solution is dropped and dried according to an embodiment of the present invention. As the water molecules evaporate, the methylene blue molecules concentrate on the nanostructure substrate. Finally, when all the water molecules evaporate, the concentrated methylene blue molecules remain on the surface of the nanostructure in the form of granules. White circles in FIG. 17A and FIG. 17B are nano-sized granules of methylene blue. Most concentrated samples are on inclined side surfaces of the nanodimples. Conventional SERS substrates generate SERS effects through point hotspots formed in very small localized nanogaps between plasmonic nanostructures, while the SERS substrate of the present invention allows light focusing into the inner space of 3D nanodimples by curvature of plasmonic nanodimples having a depth-to-radius ratio of 1.5 or above, maximizing the volume of 3D hotspots, and concentrating a very trace amount of a sample in the inner space of 3D nanodimples and thus can be useful for ultrasensitive spectroscopic sensors (SERS and PEF).

Example 6

Figure 18:
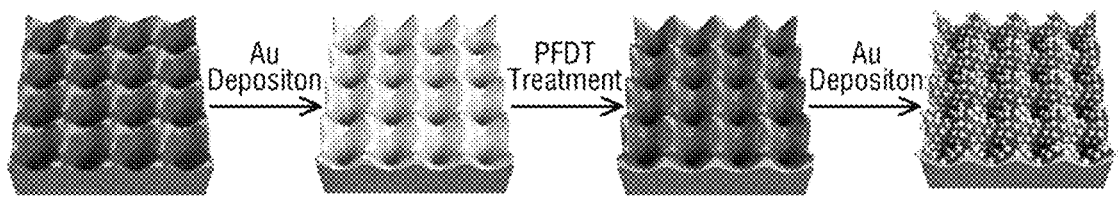
FIG. 18 is a schematic diagram illustrating a method for manufacturing a multilayer plasmonic substrate having a 3D multilayer Au nanostructure for forming Au nanoparticles on a plasmonic continuous film with curved surface according to an embodiment of the present invention.

FIG. 18 is a schematic diagram illustrating a method for manufacturing a multilayer plasmonic substrate having a 3D multilayer Au nanostructure for forming Au nanoparticles on a plasmonic continuous film with curved surface according to an embodiment of the present invention.

1. Preparation of a Substrate Including Plasmonic Continuous Film with Curved Surface Au was vacuum-deposited on a PEN substrate including nanodimples and nanotips by thermal evaporation under the following conditions.

Au Thermal evaporation
  Substrate: PEN polymer substrate treated with oxygen ion beam dose of $2.3\times10^{16}$ ions/cm$^2$ to $1.9\times10^{17}$ ions/cm$^2$
  Operating pressure: $5.0\times10^{-6}$ torr
  Au deposition rate: 2.0 Å/s
  Au deposition thickness: 100 nm 2. Formation of Self-Assembled Monolayer In order to form a self-assembled monolayer on the Au continuous thin film having the curved surface formed by the thermal evaporation, vapor deposition was performed under the following conditions.

Vapor deposition material: 1H, 1H, 2H, 2H-Perfluorodecanethiol (PFDT)
Conditions for vapor deposition
  10 μℓ of 97% PFDT was added to a glass petri dish.
  A 2×2 cm$^2$-sized Au substrate was attached to a lid of the glass petri dish and sealed to allow a deposition of PFDT vapor on the Au substrate for 2 hours.

3. Vacuum Deposition of Metal (Au) Nanoparticles

Au was deposited on a surface of the substrate on which the PFDT self-assembled monolayer had been formed under the following conditions.

Figure 19A:
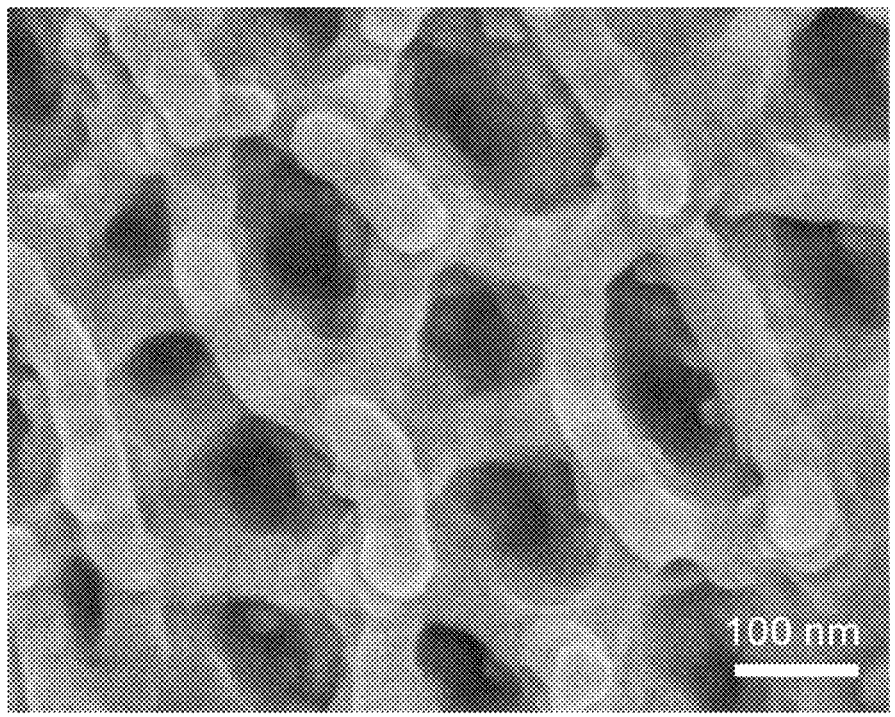
FIGS. 19A, 19B, 19C, 19D, 19E, 19F, 19G, 19H, and 19I are SEM images of various multilayer plasmonic substrates having 3D multilayer Au nanostructures according to an embodiment of the present invention.
Figure 19B:
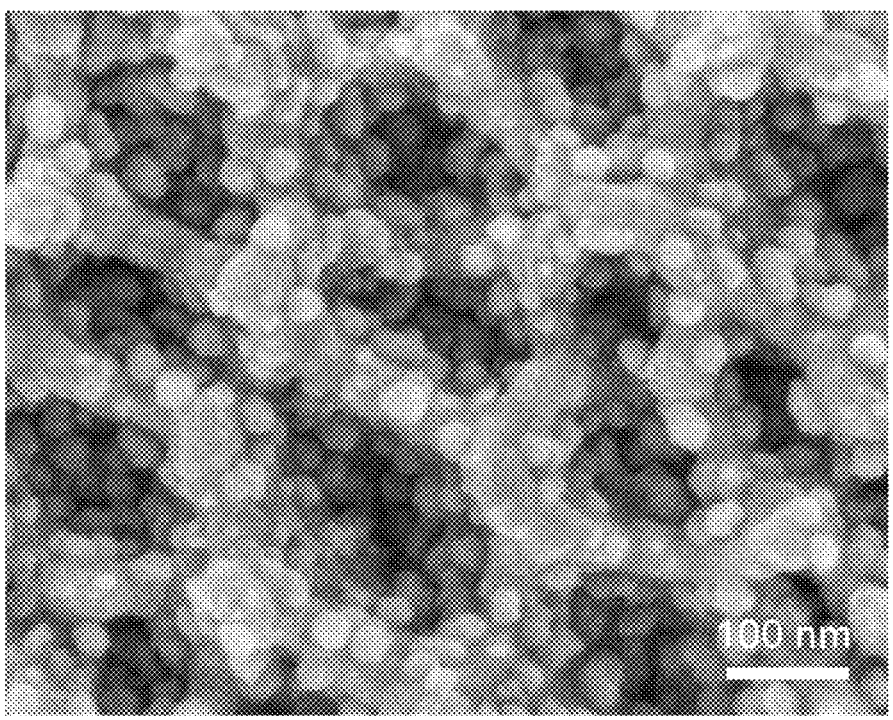
Figure 19C:
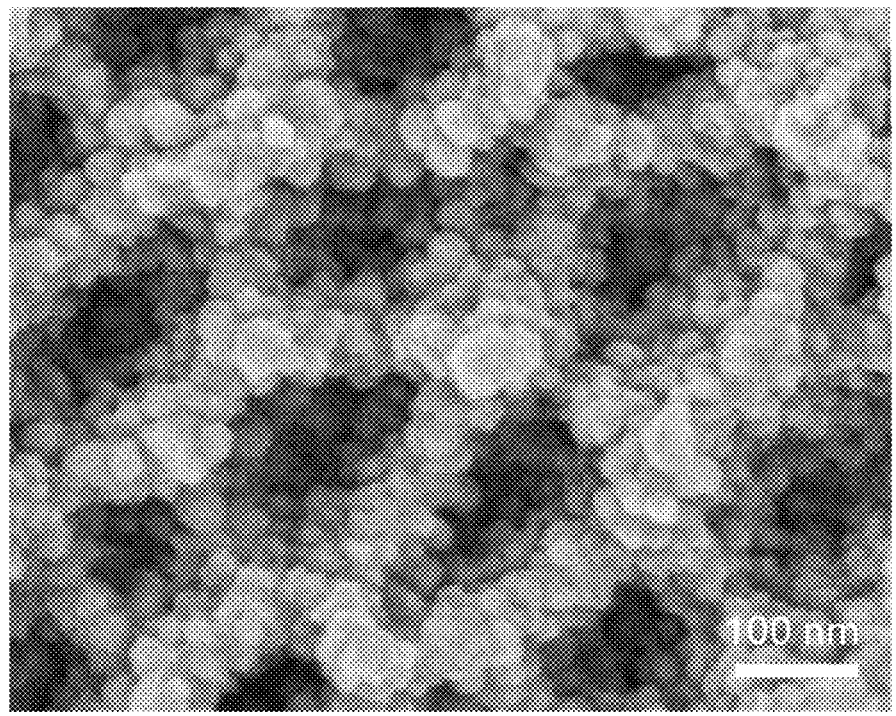
Figure 19D:
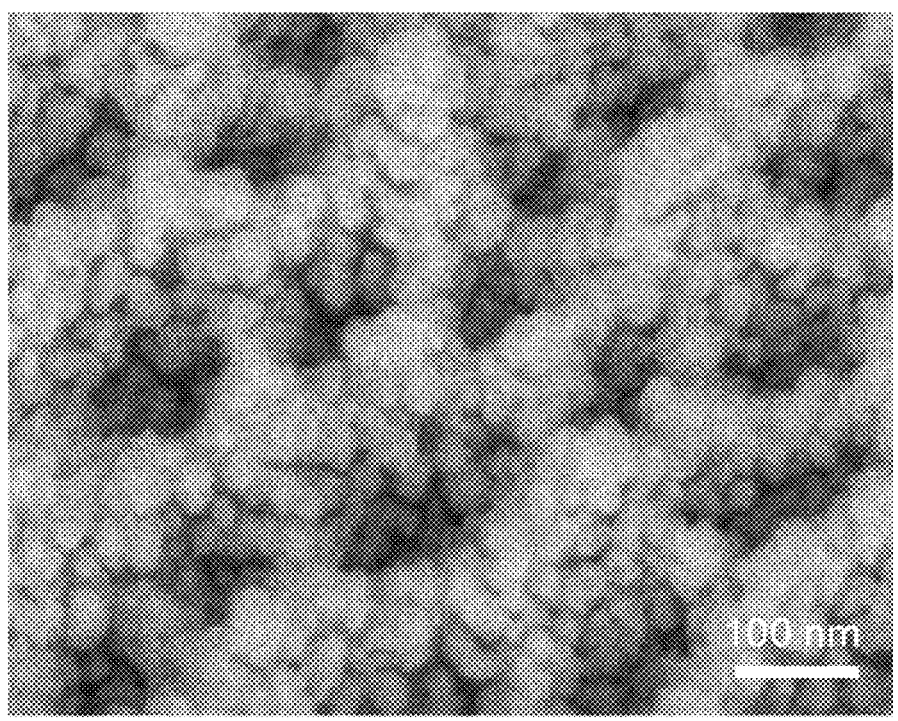
Figure 19E:
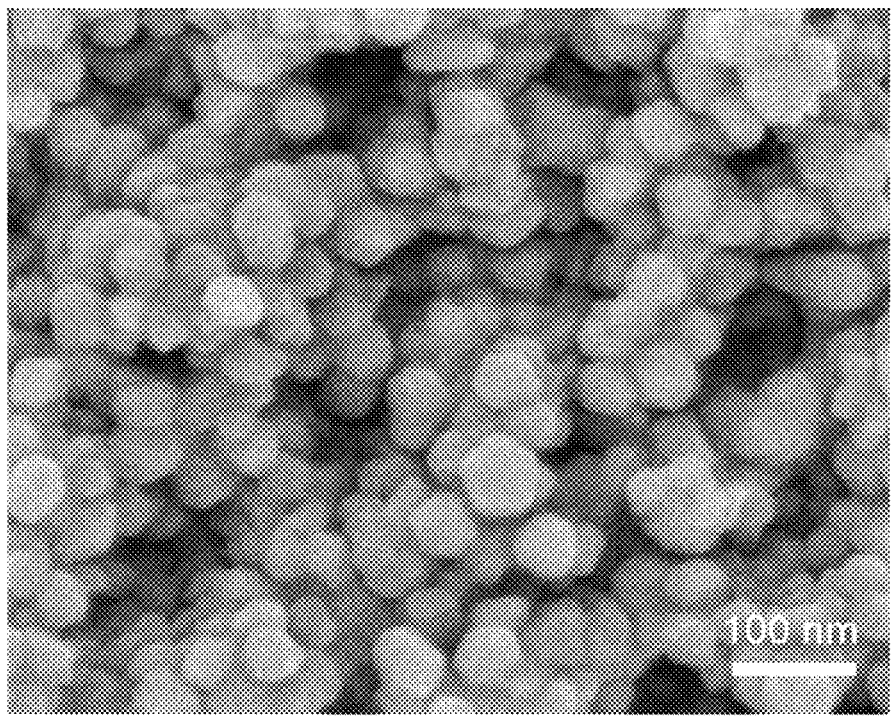
Figure 19F:
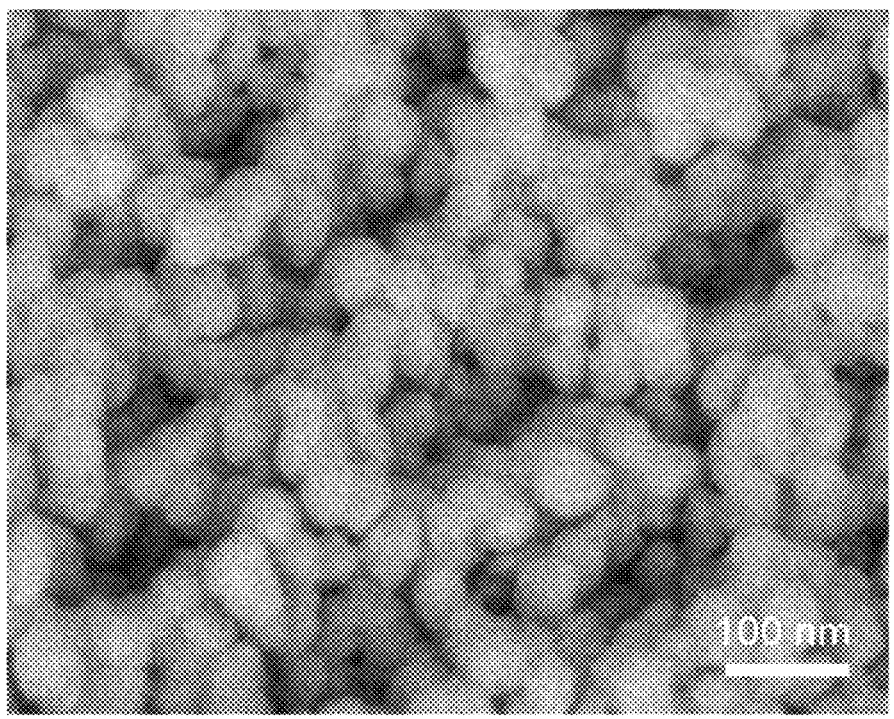
Figure 19G:
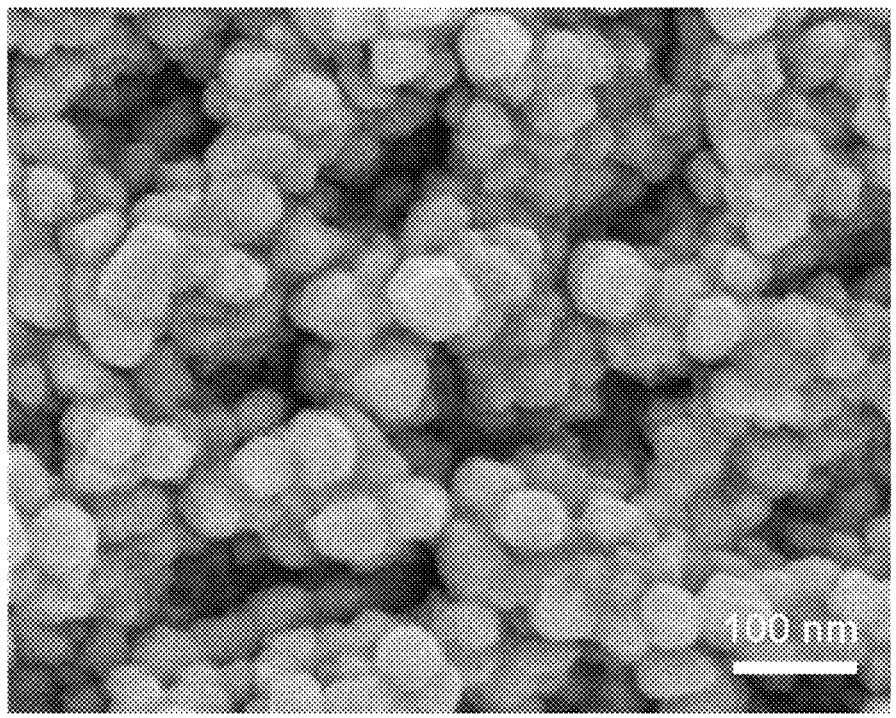
Figure 19H:
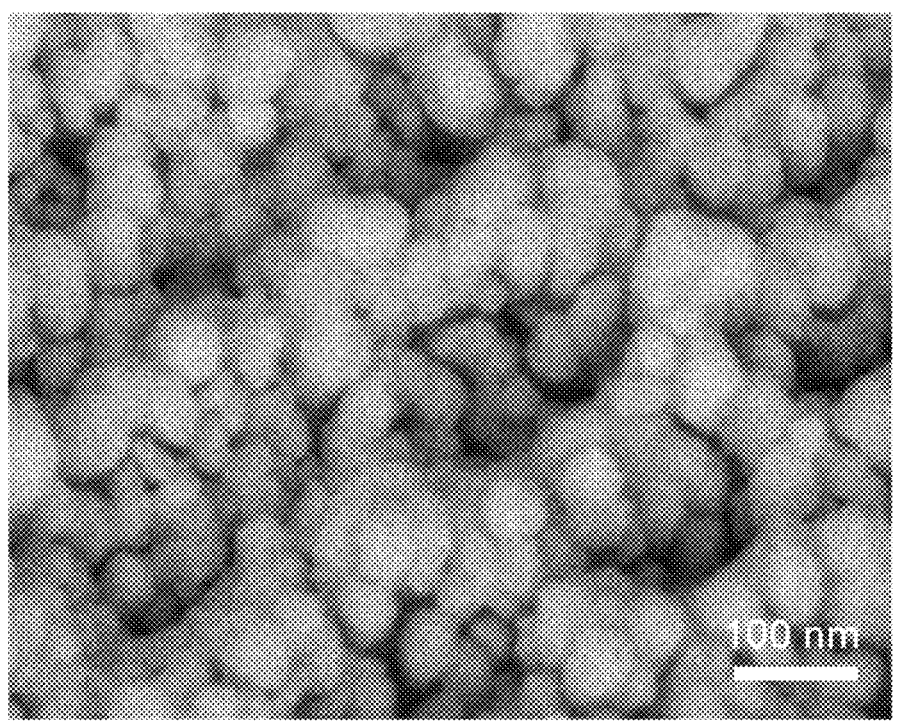
Figure 19I:
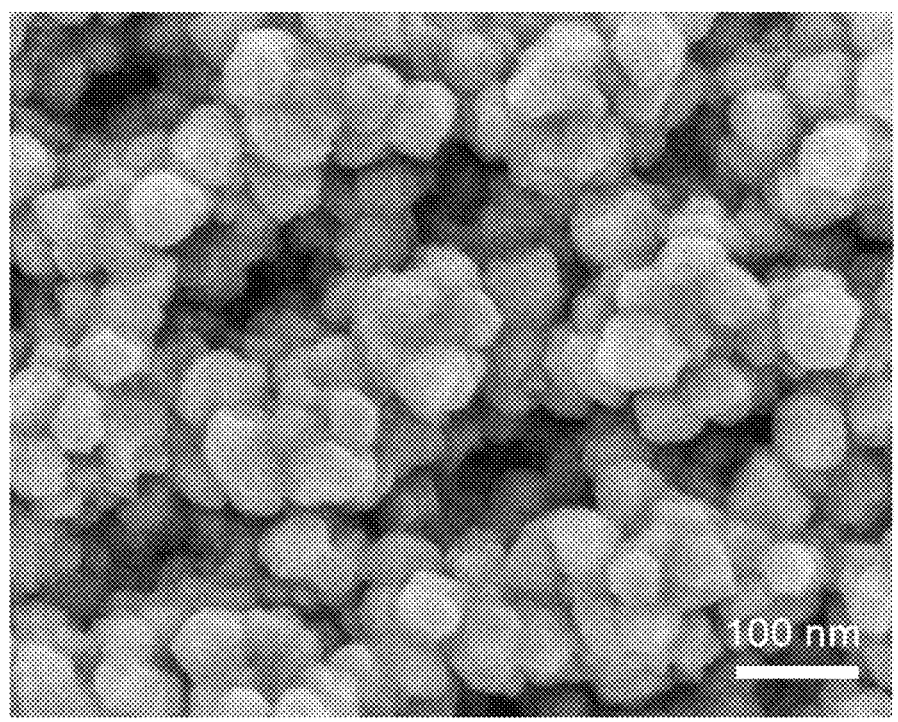

Thermal evaporation
  Operating pressure: $9.8\times10^{-6}$ torr
  Au deposition rate: 0.3 Å/s
  Au deposition thickness: 20 nm, 40 nm, 60 nm, 80 nm, 100 nm FIGS. 19A, 19B, 19C, 19D, 19E, 19F, 19G, 19H, and 19I are SEM images of various multilayer plasmonic substrates having 3D multilayer Au nanostructures according to an embodiment of the present invention. FIG. 19A is a SEM image of a substrate after 100 nm thick Au vacuum deposition on a PEN substrate treated with oxygen ion beam dose of $1.4\times10^{17}$ ions/cm$^2$. FIGS. 19B, 19C, 19D, 19E, 19F, 19G, 19H, and 19I are SEM images of a substrate depending on an Au deposition thickness after forming the PFDT self-assembled monolayer on the Au continuous thin film. It was confirmed that in case of 20 nm thick Au vacuum deposition (FIG. 19B), the Au nanoparticles were evenly formed inside the Au nanodimples and on the nanotips. It was also confirmed that when the Au vacuum deposition thickness was increased to 40 nm (FIGS. 19C and 19D), 60 nm (FIGS. 19E and 19F), 80 nm (FIGS. 19G and 19H) and 100 nm (FIG. 19I), size of Au nanoparticles initially formed became larger and a distance from neighboring nanoparticles decreased to provide nanogaps, resulting in forming hotspots due to those nanogaps. Particularly, Au nanoparticles were well formed on side surfaces of 3D nanodimples due to inclination angle of a side surface.

Figure 20A:
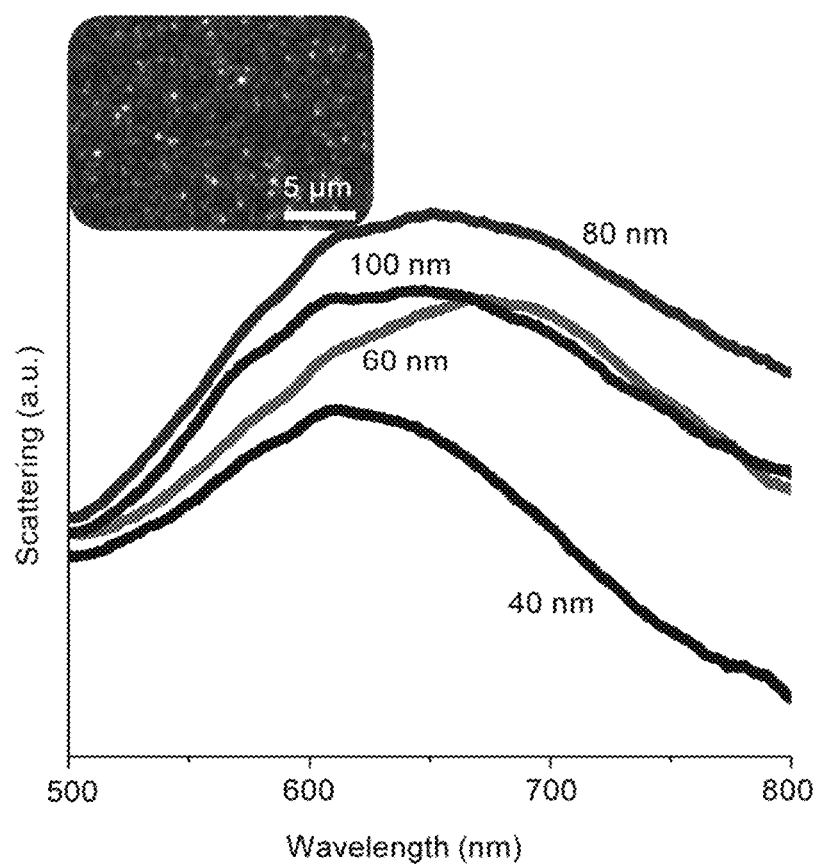
FIGS. 20A, 20B, 20C, and 20D are graphs illustrating comparison of light scattering characteristics and SERS signals depending on upper Au deposition thickness of a 3D multilayer Au nanostructure and laser wavelength according to an embodiment of the present invention.
Figure 20B:
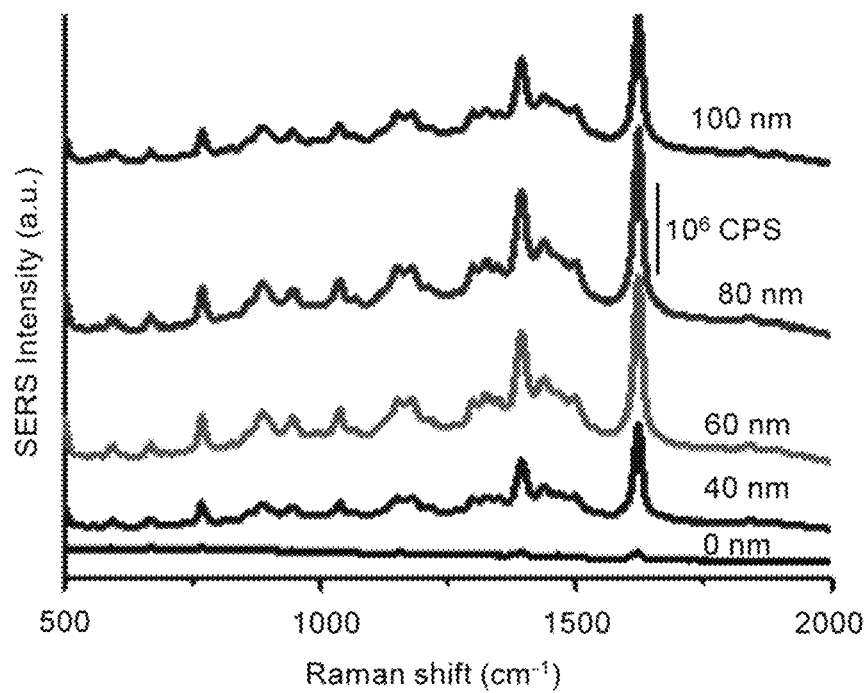
Figure 20C:
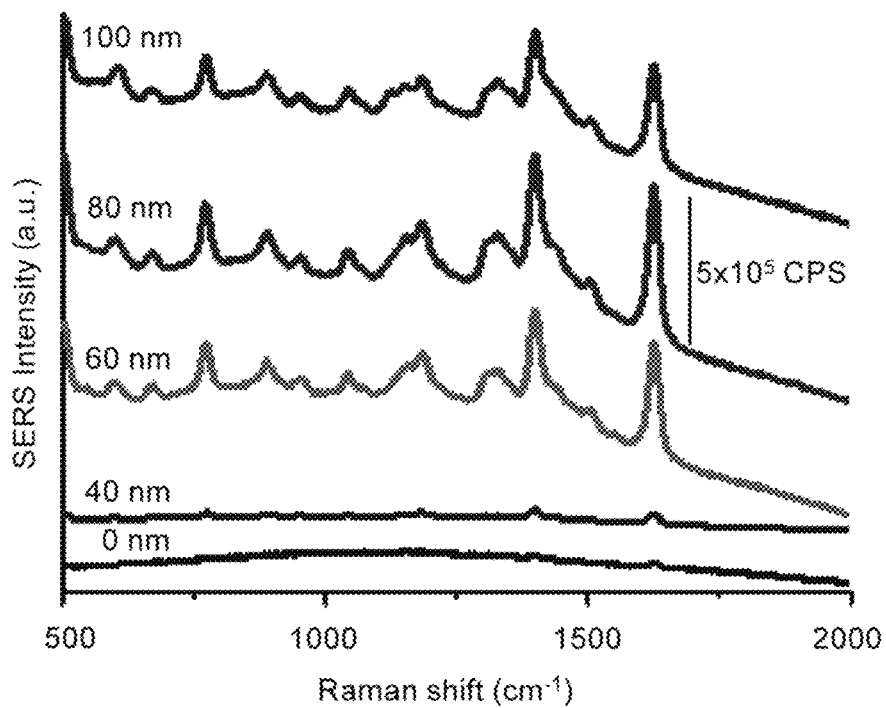

FIGS. 20A, 20B, 20C, and 20D are graphs illustrating comparison of light scattering characteristics and SERS properties according to upper Au deposition thickness of a 3D multilayer Au nanostructure and laser wavelength according to an embodiment of the present invention. Referring to FIG. 20A, as the size of the upper Au nanoparticles increased, the light scattering characteristics were greatly improved in the visible wavelengths of 600 nm or more, and the light scattering characteristics were the best in the 80 nm thick Au vacuum deposition. FIG. 20A illustrates a dark field scattering image when 80 nm thick Au vacuum deposition and confirms that red colors are highly scattered. FIG. 20B and FIG. 20C are graphs illustrating comparison of SERS signals after 3 μL of 5 μM methylene blue solution is dropped on the SERS substrate on which the 3D multilayer Au nanostructure is formed.

The measurement conditions in this example are as follows.

Figure 20D:
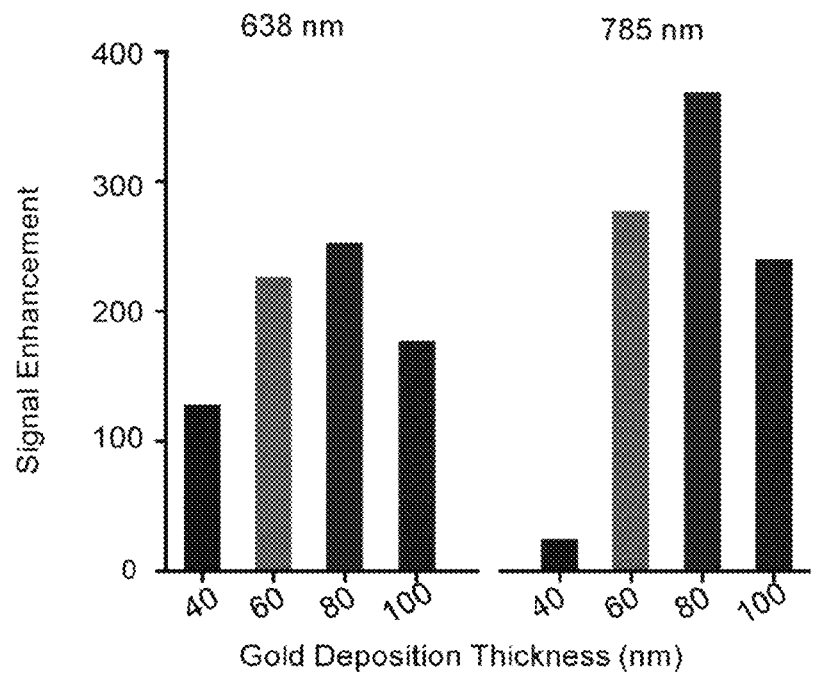

Excitation laser wavelength: 638 nm (FIG. 20B) and 785 nm (FIG. 20C)
Laser power: 10 mW
Laser spot size: 20 μm The largest SERS signal was shown in the SERS substrate on which 3D multilayer Au nanostructure was formed with 80 nm thick Au vacuum deposition at excitation laser wavelength of 638 nm (FIG. 20B) and 785 nm (FIG. 20C). The 3D multilayer Au nanostructure vacuum-deposited with 80 nm thick Au vacuum deposition increased the SERS signal by 252 times at 638 nm and 369 times at 785 nm compared with the substrate including the monolayer Au nanodimples and nanotips (FIG. 20D). The huge enhancements in SERS signal were due to the formation of a large number of Au nanoparticles inside the Au nanodimples, which formed 3D spatial hotspots formed by LSPR coupling effects.

Figure 21A:
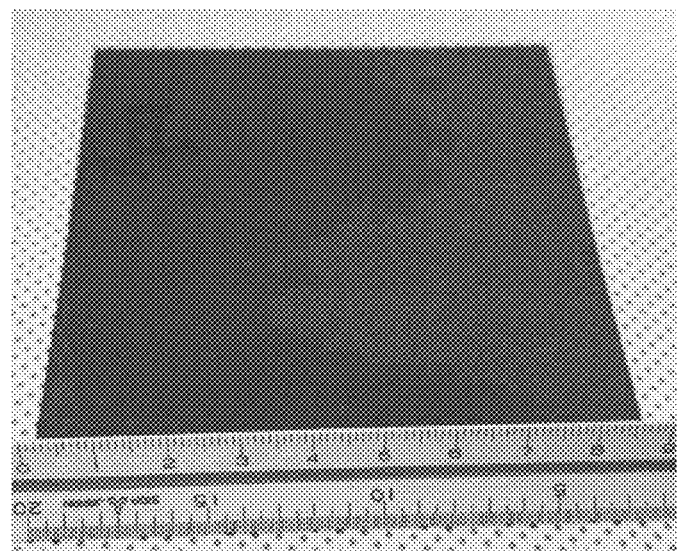
FIG. 21A is an image illustrating a large-area 3D multilayer plasmonic substrate including a plasmonic continuous film according to an embodiment of the present invention.
Figure 21B:
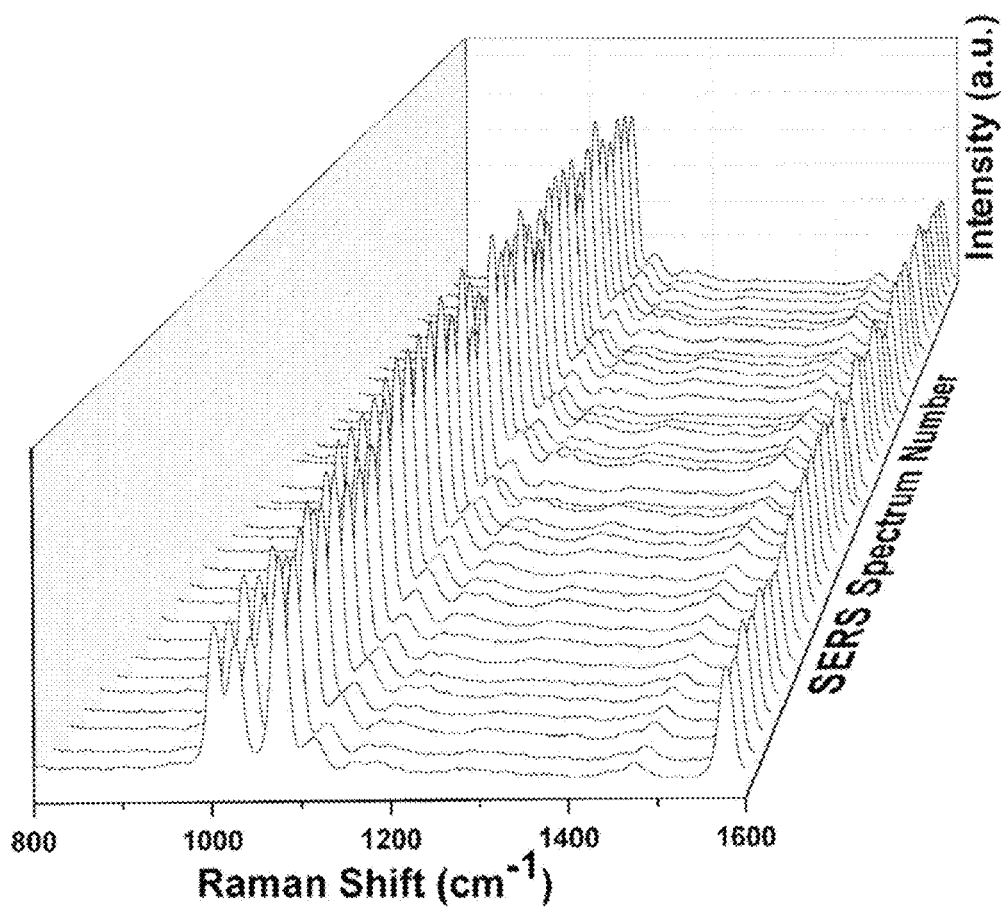
FIG. 21B and FIG. 21C are graphs illustrating the SERS signal uniformity of a large-area 3D multilayer plasmonic substrate including a plasmonic continuous film according to an embodiment of the present invention.
Figure 21C:
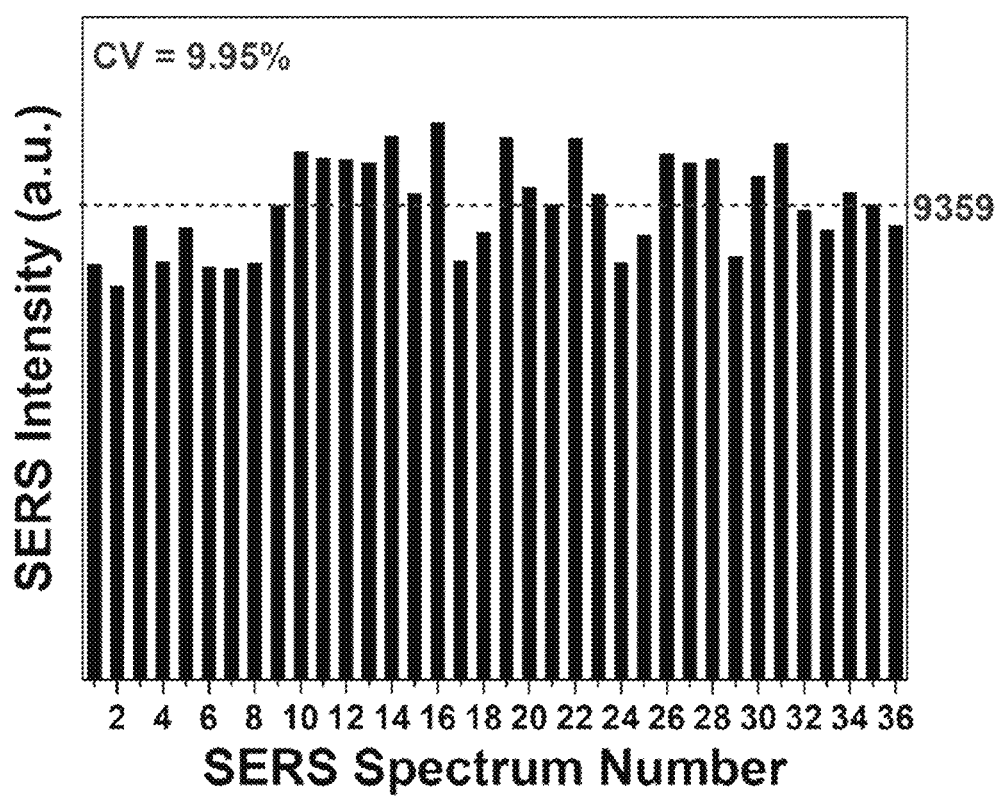

FIG. 21A is a camera image illustrating a large-area 3D multilayer plasmonic substrate including a plasmonic continuous film according to an embodiment of the present invention, and FIG. 21B and FIG. 21C are graphs illustrating the SERS signal uniformity of a large-area 3D multilayer plasmonic substrate including a plasmonic continuous film according to an embodiment of the present invention. According to Example 6, it was possible to provide a plasmonic substrate having a size of about 80 cm$^2$ which exhibited the best SERS properties and a uniform scattering color in a large area. After soaking the large-area plasmonic substrate in a 2 mM benzenethiol solution for 2 hours, the benzenethiol molecules could form a self-assembled monolayer on the 3D multilayer plasmonic substrate, and then SERS signal intensities of benzenethiol were measured at 36 points in total in 1.5 cm intervals. Referring to FIG. 21B and FIG. 21C, it was confirmed that unique SERS signals from benzenethiol were detected and a signal error in the large area was less than 10%.

Comparative Example 2

1. Preparation of PET Nanopillars

Ar plasma treatment was performed on a PET polymer substrate to provide PET nanopillars under the following conditions.

Base pressure: 6.8×10$^{-3}$ torr
Plasma treatment of polymer substrate
   Operating pressure: 8.0×10$^{-2}$ torr
   Operation gas: Ar 5 sccm
   RF plasma power: 100 W
   Treatment time: 2 min 2. Metal Vacuum Deposition Au was vacuum deposited by thermal evaporation on the polymer nanopillars formed above under the following conditions.

Au Thermal evaporation
   Operating pressure: 9.8×10$^{-6}$ torr
   Au deposition rate: 2.0 Å/s
   Au deposition thickness: 100 nm 3. Formation of Self-Assembled Monolayer In order to form a self-assembled monolayer on the PET/Au nanopillars formed by the metal vacuum deposition, vapor deposition was performed under the following conditions.

Vapor deposition material: 1H, 1H, 2H, 2H-Perfluorodecanethiol (PFDT)
Conditions for vapor deposition
   10 μl of 97% PFDT was added to a glass petri dish.
   A 2×2 cm$^2$-sized Au substrate was attached to a lid of the glass petri dish and sealed to allow deposition of PFDT vapor on the Au substrate for 2 hours.

4. Vacuum Deposition of Au Nanoparticles

Au was deposited on a surface of the substrate on which the PFDT self-assembled monolayer was formed under the following conditions.

Figure 22A:
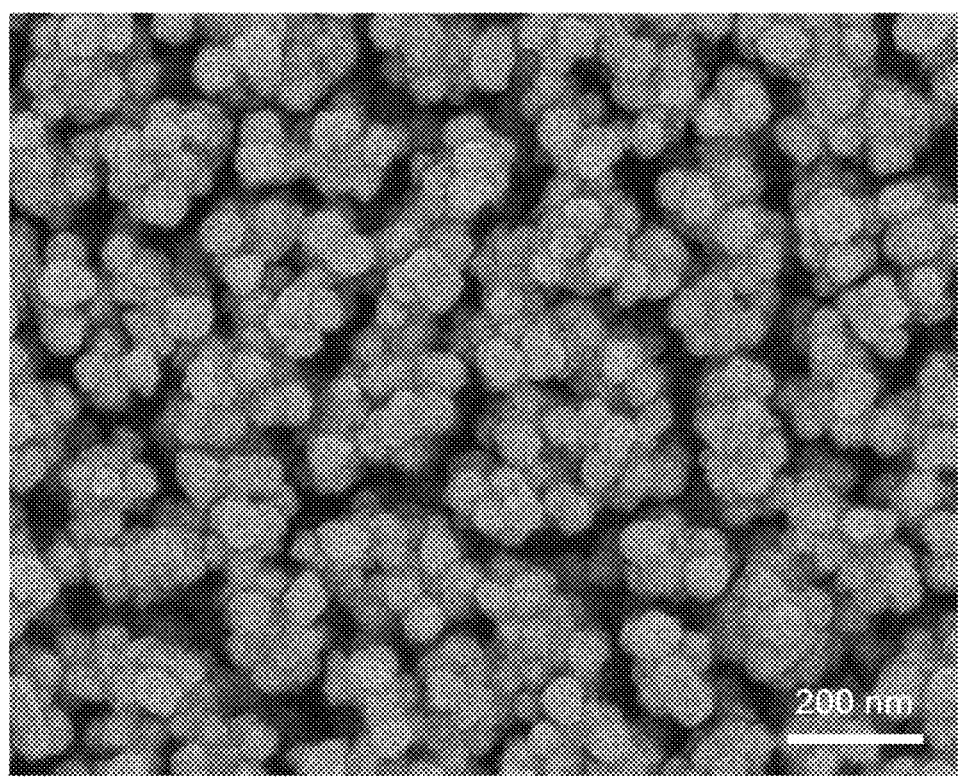
FIGS. 22A and 22B are SEM images illustrating comparison of a plasmonic substrate when 100 nm thick Au, PFDT monolayer and 80 nm thick Au are vacuum-deposited on polymer nanopillars according to a comparative embodiment of the present invention.
Figure 22B:
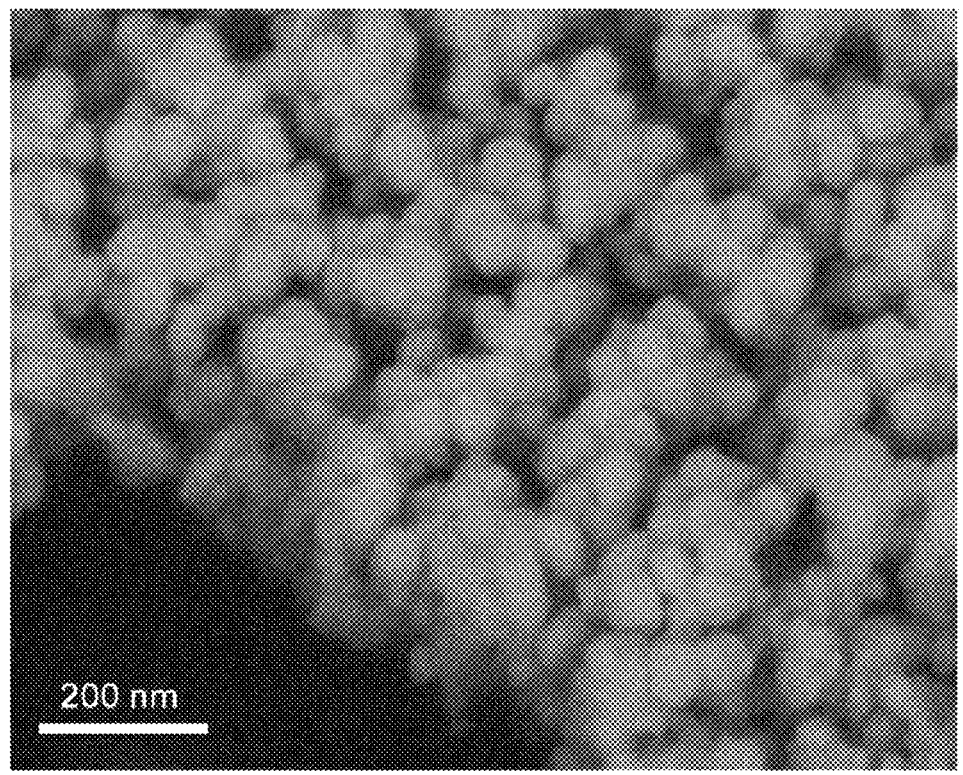

Thermal evaporation
   Operating pressure: 9.8×10$^{-6}$ torr
   Au deposition rate: 0.3 Å/s
   Au deposition thickness: 80 nm FIGS. 22A and 22B are SEM images illustrating comparison of a plasmonic substrate when 100 nm thick Au, PFDT monolayer and 80 nm thick Au are vacuum-deposited on polymer nanopillars according to a Comparative Example of the present invention. It was noted that high density spherical Au nanoparticles were well formed on the PET/Au nanopillars.

Figure 23:
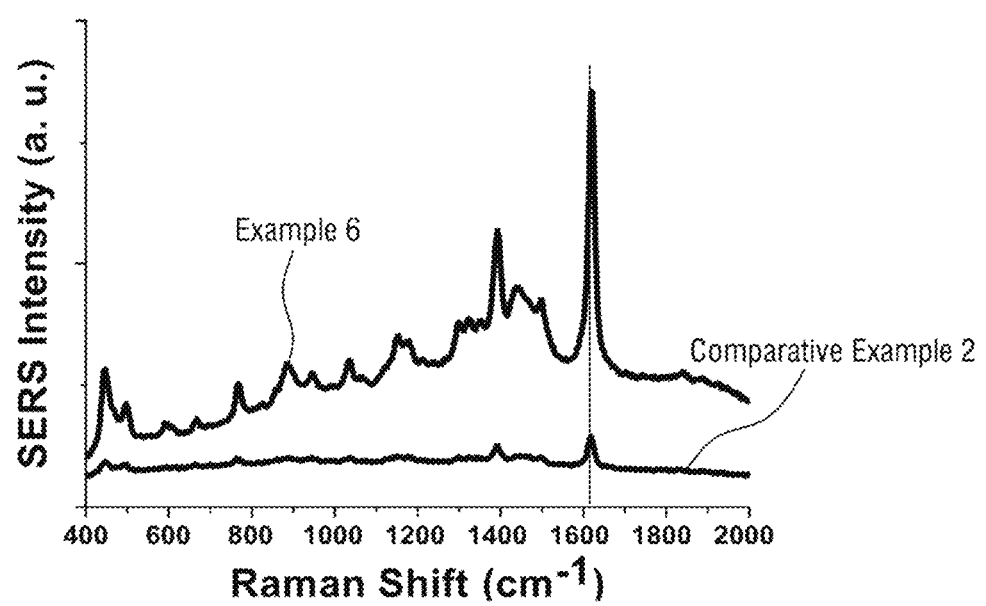
FIG. 23 is a graph illustrating comparison between a SERS signal of a substrate including polymer nanopillars formed according to a comparative embodiment and a SERS signal of a 3D multilayer plasmonic substrate formed on a polymer substrate having curved surface inducing nanodimples and nanotips according to an embodiment of the present invention.

FIG. 23 is a graph illustrating comparison between a SERS signal of a substrate including polymer nanopillars formed according to a Comparative Example and a SERS signal of a 3D multilayer plasmonic substrate formed on a polymer substrate having curved surface inducing nanodimples and nanotips according to an Example of the present invention.

3 μL of 5 μM methylene blue solution was dropped on the SERS substrate and dried, and the measured SERS signals were compared.

The measurement conditions in this example are as follows.

Excitation laser wavelength: 638 nm
Laser power: 10 mW
Laser spot size: 20 μm

It was confirmed that the 3D multilayer SERS substrate formed by Example 6 of the present invention had a signal increase of 8.6 times compared to the SERS substrate including 3D multilayer nanopillars formed by Comparative Example 2. When Au nanoparticles were formed on PFDT-coated Au nanopillars, Au nanoparticle deposition was concentrated only on the upper part of the nanopillars, which prevented Au nanoparticles from forming on the side surfaces and bottom part of the nanopillars, reducing the density and volume of the hotspots. On the other hand, when Au nanoparticles were formed on the nanodimples formed by an Example of the present invention, the Au nanoparticles were formed not only on the nanotips but also on inclined side surfaces of the nanodimples, thereby increasing the density and volume of hotspots. Accordingly, the structural properties of the 3D plasmonic continuous film with curved surface could provide a substrate for an ultrasensitive spectroscopic sensor exhibiting excellent optical properties.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF REFERENCE NUMERALS

10: Base substrate
12: Nanodimples
14: Nanotips
20: Plasmonic continuous film
22: Plasmonic nanodimples
24: Plasmonic nanotips

What is claimed is:

1. A substrate comprising:
a base substrate comprising bowl-curved-shaped nanodimples and spiked nanotips formed at contact points between the bowl-curved-shaped nanodimples; and
a plasmonic continuous film with a curved surface formed on the base substrate, the curved surface comprising plasmonic nanodimples formed over the bowl-curved-shaped nanodimples,
wherein a depth-to-radius ratio of each of the plasmonic nanodimples formed of the plasmonic continuous film is 1.5 or above,
wherein inclination angles of side surfaces of each of the bowl-curved-shaped nanodimples are in a range from 30 to 60 degrees.

2. The substrate of claim 1, wherein an inclination angle of a side surface of each plasmonic nanodimple of the plasmonic continuous film is in a range from 30 to 60 degrees.

3. The substrate of claim 1, wherein the base substrate is made of one or more selected from polymer, glass, silicon, and paper.

4. The substrate of claim 1, wherein a depth-to-radius ratio of each of the bowl-curved-shaped nanodimples of the base substrate is 1.5 or above.

5. The substrate of claim 1, wherein a surface density of each of the bowl-curved-shaped nanodimples of the base substrate is in a range from 30/µm² to 80/µm².

6. The substrate of claim 1, wherein a surface density of the spiked nanotips formed of the base substrate is in a range from 40/µm² to 90/µm².

7. The substrate of claim 1, wherein the bowl-curved-shaped nanodimples and the spiked nanotips are formed by ion beam treatment, plasma etching, soft lithography, nano-imprint lithography, or photo lithography.

8. The substrate of claim 1, wherein a diameter of each plasmonic nanodimple of the plasmonic continuous film is in a range from 10 nm to 100 nm.

9. The substrate of claim 1, wherein a surface density of the plasmonic nanodimples of the plasmonic continuous film is in a range from 30/µm² to 80/µm².

10. The substrate of claim 1, wherein the curved surface comprises plasmonic nanotips formed over the spiked nanotips of the base substrate, wherein a surface density of the plasmonic nanotips of the plasmonic continuous film is in a range from 40/µm² to 90/µm².

11. The substrate of claim 1, wherein a thickness of the plasmonic continuous film is 10 nm to 200 nm.

12. The substrate of claim 1, wherein the plasmonic continuous film is formed by a vacuum deposition or a solution process.

13. The substrate of claim 1, wherein the plasmonic continuous film is a metal-containing film.

14. The substrate of claim 13, wherein the metal is Au, Ag, Cu, Al, Pt, Pd, Ti, Rd, Ru, or an alloy thereof.

15. The substrate of claim 13, further comprising metal-containing nanoparticles formed on the metal-containing film.

16. The substrate of claim 13, further comprising an insulating layer and an additional metal-containing film formed on the metal-containing film.

17. The substrate of claim 1, wherein the bowl-curved-shaped nanodimples and spiked nanotips of the base substrate are made of polyethylene naphthalate (PEN).

* * * * *